US011404517B2

(12) United States Patent
Yun et al.

(10) Patent No.: US 11,404,517 B2
(45) Date of Patent: Aug. 2, 2022

(54) DISPLAY PANEL

(71) Applicant: Samsung Display Co., Ltd., Yongin-si (KR)

(72) Inventors: Jong Hyun Yun, Yongin-si (KR); Pil Suk Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 211 days.

(21) Appl. No.: 16/918,320

(22) Filed: Jul. 1, 2020

(65) Prior Publication Data
US 2021/0151539 A1 May 20, 2021

(30) Foreign Application Priority Data
Nov. 18, 2019 (KR) .................. 10-2019-0147338

(51) Int. Cl.
*H01L 27/32* (2006.01)
*G09G 3/20* (2006.01)

(52) U.S. Cl.
CPC ........... *H01L 27/3265* (2013.01); *G09G 3/20* (2013.01); *H01L 27/3276* (2013.01); *G09G 2300/0426* (2013.01); *G09G 2300/0465* (2013.01)

(58) Field of Classification Search
CPC ............. H01L 27/3265; H01L 27/3276; H01L 27/3248; G09G 3/20; G09G 3/3258; G09G 3/3208; G09G 3/3266; G09G 3/2092
See application file for complete search history.

(56) References Cited

U.S. PATENT DOCUMENTS

| | | | |
|---|---|---|---|
| 7,277,071 B2 | 10/2007 | Oh | |
| 9,530,854 B2 | 12/2016 | Choi | |
| 10,311,793 B2 | 6/2019 | Chai et al. | |
| 10,622,436 B2 * | 4/2020 | Park | G09G 3/3258 |
| 10,700,104 B2 * | 6/2020 | Lee | H01L 27/1255 |
| 10,706,755 B2 * | 7/2020 | Ju | G09G 3/3258 |
| 10,783,834 B2 * | 9/2020 | Lee | H01L 27/3276 |
| 10,991,305 B2 * | 4/2021 | Park | G09G 3/3258 |
| 11,158,262 B2 * | 10/2021 | Gu | G09G 3/3275 |
| 2008/0136795 A1 * | 6/2008 | Numao | G09G 3/3233 345/204 |
| 2018/0226023 A1 | 8/2018 | Park et al. | |

(Continued)

FOREIGN PATENT DOCUMENTS

| | | |
|---|---|---|
| KR | 10-0490622 B1 | 5/2005 |
| KR | 10-2015-0098281 A | 8/2015 |
| KR | 10-2017-0130681 A | 11/2017 |

(Continued)

OTHER PUBLICATIONS

Lee, Baek-woon, et al. "51.1: Novel Simultaneous Emission Driving Scheme for Crosstalk-free 3D AMOLED TV." Journal of the Society for Information Display (SID) 2010 Digest, p. 758-761.

*Primary Examiner* — Sardis F Azongha
(74) *Attorney, Agent, or Firm* — Lewis Roca Rothgerber Christie LLP

(57) ABSTRACT

A display panel includes: a first scan line, a second scan line, and a third scan line; a data line; a first pixel in a first pixel area, connected to the first scan line and the second scan line, and connected to the data line through a first capacitor; and a second pixel in a second pixel area, connected to the second scan line and the third scan line, and connected to the data line through the first capacitor.

20 Claims, 14 Drawing Sheets

(56) References Cited

U.S. PATENT DOCUMENTS

2018/0226028 A1   8/2018  Park et al.
2019/0035336 A1   1/2019  Park et al.

FOREIGN PATENT DOCUMENTS

| KR | 10-2018-0091985 A | 8/2018 |
| KR | 10-2018-0093147 A | 8/2018 |
| KR | 10-2019-0012303 A | 2/2019 |

* cited by examiner

DISPLAY PANEL

CROSS-REFERENCE TO RELATED APPLICATION

The present application claims priority to and the benefit of Korean Patent Application No. 10-2019-0147338, filed on Nov. 18, 2019, and all the benefits accruing therefrom under 35 U.S.C. § 119, the content of which in its entirety is herein incorporated by reference.

BACKGROUND

1. Field

Aspects of some example embodiments of the present disclosure relate to a display panel.

2. Description of the Related Art

A display device may include a display panel, and the display panel may include a transistor, a capacitor, and various signal lines. The display device may display an image in a sequential light emission method in which pixels sequentially emit light in a pixel row unit or in a simultaneous light emission method in which all pixels simultaneously emit light after sequentially completing data writing.

In a situation where the display device is driven in the simultaneous light emission method, in order to reduce display defects such as luminance deviation, the display device may further include configurations (for example, a line, a transistor, and the like) for compensating for a threshold voltage of a driving transistor and initializing an electrode of a light emitting element. In this case, because of the additional circuit components for compensation, a size of a pixel area included in the display panel may increase, and there may be difficulty in high resolution and high integration.

The above information disclosed in this Background section is only for enhancement of understanding of the background and therefore the information discussed in this Background section does not necessarily constitute prior art.

SUMMARY

Aspects of some example embodiments of the disclosure include a display panel having relatively high resolution and high integration.

A display panel according to some example embodiments of the disclosure may include a first scan line, a second scan line, and a third scan line, a data line, a first pixel in a first pixel area, connected to the first scan line and the second scan line, and connected to the data line through a first capacitor, and a second pixel in a second pixel area, connected to the second scan line and the third scan line, and connected to the data line through the first capacitor.

According to some example embodiments, the first to third scan lines may extend in a first direction, the data line may extend in a second direction crossing the first direction, and the first pixel area and the second pixel area may be adjacent to each other along the second direction.

According to some example embodiments, the first pixel may include a first transistor including a gate electrode connected to a first node, a first electrode connected to a first power, and a second electrode connected to a second node, a second transistor including a gate electrode connected to the first scan line, a first electrode connected to the first node, and a second electrode connected to a third node, a third transistor including a gate electrode connected to the second scan line, a first electrode connected to the third node, and a second electrode connected to the second node, a first light emitting element including a first electrode connected to the second node and a second electrode connected to a second power, and a second capacitor including a first electrode connected to the first node and a second electrode connected to a third power. The first capacitor may include a first electrode connected to the data line and a second electrode connected to the third node.

According to some example embodiments, the second pixel may include a fourth transistor including a gate electrode connected to a fourth node, a first electrode connected to the first power, and a second electrode connected to a fifth node, a fifth transistor including a gate electrode connected to the third scan line, a first electrode connected to the fourth node, and a second electrode connected to a sixth node, a sixth transistor including a gate electrode connected to the second scan line, a first electrode connected to the sixth node, and a second electrode connected to the fifth node, a second light emitting element including a first electrode connected to the fifth node and a second electrode connected to the second power, and a third capacitor including a first electrode connected to the fourth node and a second electrode connected to the third power. The second electrode of the first capacitor may be connected to the sixth node.

According to some example embodiments, the second transistor may include a first sub transistor including a gate electrode connected to the first scan line, a first electrode connected to the first node, and a second electrode, and a second sub transistor including a gate electrode connected to the first scan line, a first electrode connected to the second electrode of the first sub transistor, and a second electrode connected to the third node. The fifth transistor may include a third sub transistor including a gate electrode connected to the third scan line, a first electrode connected to the fourth node, and a second electrode, and a fourth sub transistor including a gate electrode connected to the third scan line, a first electrode connected to the second electrode of the third sub transistor, and a second electrode connected to the sixth node.

According to some example embodiments, the second electrode of the first capacitor may be positioned in the first and second pixel areas, and a portion of the data line may overlap the second electrode of the first capacitor to form the first electrode of the first capacitor.

According to some example embodiments, the first pixel and the second pixel may be symmetrical with respect to a boundary line to which the first pixel area and the second pixel area are adjacent.

According to some example embodiments, the first pixel and the second pixel may emit light with different colors.

According to some example embodiments, the second pixel may include a fourth transistor including a gate electrode connected to a fourth node, a first electrode connected to the first power, and a second electrode connected to a fifth node, a fifth transistor including a gate electrode connected to the second scan line, a first electrode connected to the fourth node, and a second electrode connected to a sixth node, a sixth transistor including a gate electrode connected to the third scan line, a first electrode connected to the sixth node, and a second electrode connected to the fifth node, a second light emitting element including a first electrode connected to the fifth node and a second electrode connected to the second power, and a third capacitor including a first electrode connected to the fourth node and a second electrode connected to the third power. The second electrode of the first capacitor may be connected to the sixth node.

According to some example embodiments, the display panel may further include a fourth scan line extending in the first direction, and a third pixel in a third pixel area, connected to the second scan line and the fourth scan line, and connected to the data line through the first capacitor. The third pixel area may be adjacent to the second pixel area along the second direction.

A display panel according to some example embodiments of the disclosure may include a substrate including a first pixel area and a second pixel area, a semiconductor layer including a first semiconductor pattern in the first pixel area of the substrate and a second semiconductor pattern in the second pixel area of the substrate, a first conductive layer on the semiconductor layer, and including a first gate electrode overlapping the first semiconductor pattern and a second gate electrode overlapping the second semiconductor pattern, a second conductive layer on the first conductive layer, and including a first scan line extending in a first direction and in the first pixel area, and a second scan line extending in the first direction and in the second pixel area, a third conductive layer on the second conductive layer, and including a data line extending across the first and second pixel areas in a second direction crossing the first direction, and a fourth conductive layer on the third conductive layer, overlapping a portion of the data line, and including a first electrode of a first capacitor over the first and second pixel areas. The first electrode of the first capacitor may be electrically connected to each of the first and second semiconductor patterns. The portion of the data line overlapping the first electrode of the first capacitor may configure a second electrode of the first capacitor.

According to some example embodiments, the third conductive layer may further include a third electrode in the first pixel area and electrically connected to the data line, and a fourth electrode in the second pixel area and electrically connected to the data line. The third and fourth electrodes may overlap the first electrode of the first capacitor and may further configure the second electrode of the first capacitor.

According to some example embodiments, the first semiconductor pattern may include a first sub semiconductor pattern, a second sub semiconductor pattern, and a third sub semiconductor pattern connecting one side of the first sub semiconductor pattern and one side of the second sub semiconductor pattern to each other. The second semiconductor pattern may include a fourth sub semiconductor pattern, a fifth sub semiconductor pattern, and a sixth sub semiconductor pattern connecting one side of the fourth sub semiconductor pattern and one side of the fifth sub semiconductor pattern to each other.

According to some example embodiments, the first electrode of the first capacitor may be connected between the second sub semiconductor pattern and the third sub semiconductor pattern, and may be connected between the fifth sub semiconductor pattern and the sixth sub semiconductor pattern.

According to some example embodiments, the first gate electrode may include a first sub gate electrode overlapping the first sub semiconductor pattern, a second sub gate electrode overlapping the second sub semiconductor pattern, and a third sub gate electrode overlapping the third sub semiconductor pattern. The second gate electrode may include a fourth sub gate electrode overlapping the fourth sub semiconductor pattern, a fifth sub gate electrode over-lapping the fifth sub semiconductor pattern, and a sixth sub gate electrode overlapping the sixth sub semiconductor pattern.

According to some example embodiments, the second conductive layer may further include a second electrode of a second capacitor on the first pixel area and overlapping a portion of the first sub gate electrode, and a second electrode of a third capacitor on the second pixel area and overlapping a portion of the fourth sub gate electrode. The portion of the first sub gate electrode overlapping the second electrode of the second capacitor may configure the first electrode of the second capacitor. The portion of the fourth sub gate electrode overlapping the second electrode of the third capacitor may configure a first electrode of the third capacitor.

According to some example embodiments, the second conductive layer may further include a first bridge pattern on the first pixel area, and overlapping the first sub gate electrode and another side of the second sub semiconductor pattern to electrically connect the first sub gate electrode and the another side of the second sub semiconductor pattern to each other, and a second bridge pattern on the second pixel area, and overlapping the fourth sub gate electrode and another side of the fifth sub semiconductor pattern to electrically connect the fourth sub gate electrode and the another side of the fifth sub semiconductor pattern.

According to some example embodiments, the second conductive layer may further include a third scan line extending in the first direction and in the first pixel area, and a fourth scan line extending in the first direction, in the second pixel area, and electrically connected to the third scan line. The first scan line may be electrically connected to the second sub gate electrode, the third scan line may be electrically connected to the third sub gate electrode, the second scan line may be electrically connected to the fifth sub gate electrode, and the fourth scan line may be electrically connected to the sixth sub gate electrode.

According to some example embodiments, the fourth conductive layer may further include an initialization power line extending across the first and second pixel areas in the second direction. The initialization power line may overlap the second electrode of the second capacitor and the second electrode of the third capacitor to be electrically connected to the second electrode of the second capacitor and the second electrode of the third capacitor.

According to some example embodiments, the fourth conductive layer may further include a driving power line extending across the first and second pixel areas in the second direction. The driving power line may overlap another side of the first sub semiconductor pattern and another side of the fourth sub semiconductor pattern to be electrically connected to the another side of the first sub semiconductor pattern and the another side of the fourth sub semiconductor pattern.

In the display panel according to some example embodiments the disclosure, two adjacent pixels may share a capacitor connected to the data line. Therefore, a size of the pixel area may be reduced, and thus a display panel of high resolution and high integration may be implemented.

In addition, in the display panel according to some example embodiments of the disclosure, two adjacent pixels may share the capacitor connected to the data line. Therefore, the area of the electrode included in the capacitor may be largely formed. Thus, a capacitance of the capacitor may be improved without increasing the pixel area.

BRIEF DESCRIPTION OF THE DRAWINGS

The above and other aspects of some example embodiments according to the invention will become more apparent by describing in further detail aspects of some example embodiments thereof with reference to the accompanying drawings, in which.

DETAILED DESCRIPTION

Figure 1:
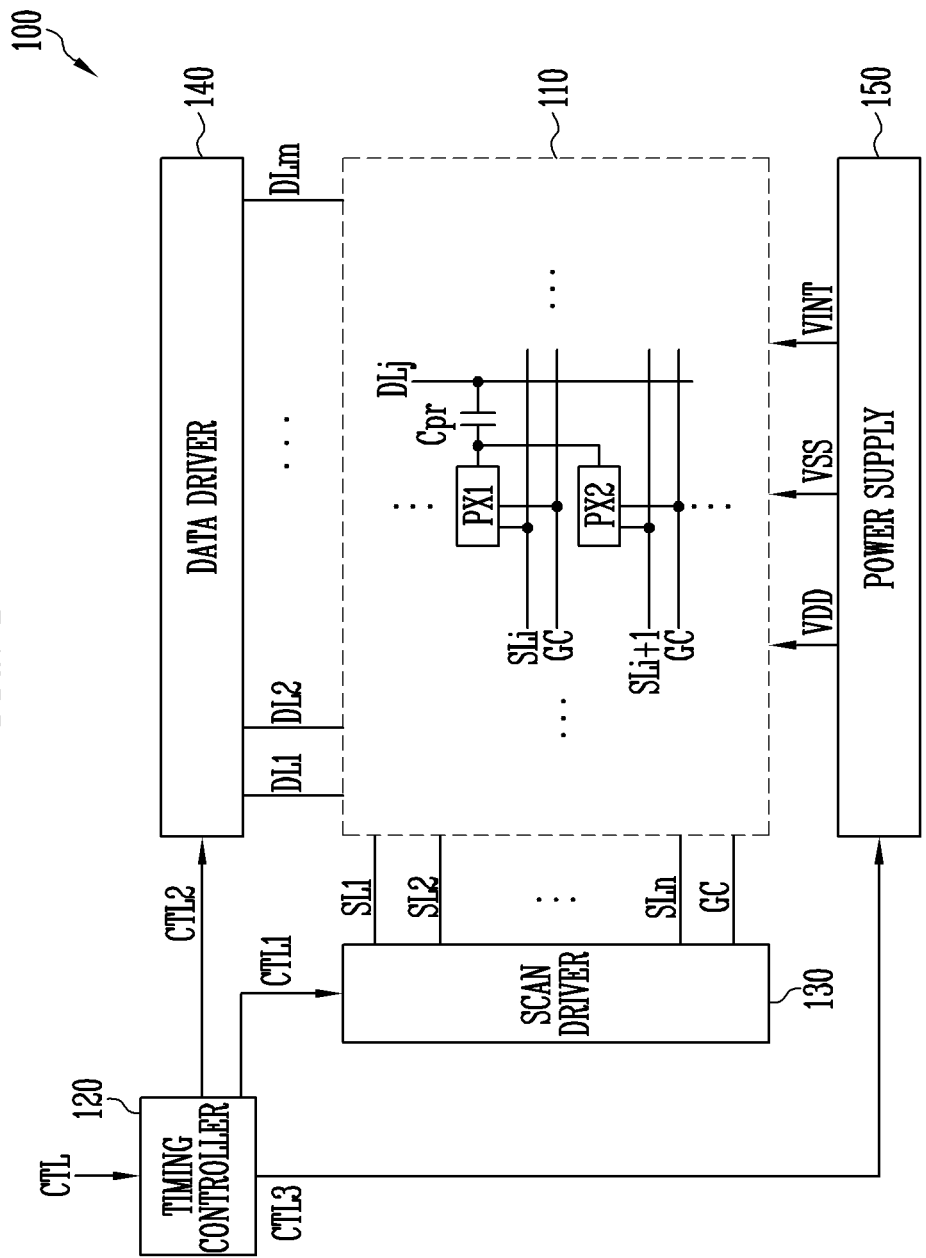
FIG. 1 is a diagram illustrating a display device according to some example embodiments of the disclosure.

Example embodiments according to the disclosure may be modified in various manners and have various forms. Therefore, example embodiments will be illustrated in the drawings and will be described in more detail in the specification. However, it should be understood that the disclosure is not intended to be limited to the disclosed example embodiments, and the disclosure includes all modifications, equivalents, and substitutions within the spirit and technical scope of embodiments according to the disclosure.

Similar reference numerals are used for similar components in describing each drawing. In the accompanying drawings, the dimensions of the structures are shown enlarged from the actual dimensions for the sake of clarity of the disclosure. Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. The singular expressions include plural expressions unless the context clearly indicates otherwise.

It should be understood that in the present application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a portion of a layer, a film, an area, a plate, or the like is referred to as being "on" another portion, it includes not only a case where the portion is "directly on" another portion, but also a case where there is further another portion between the portion and another portion. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion.

Hereinafter, aspects of some example embodiments of the disclosure will be described in more detail with reference to the accompanying drawings.

FIG. 1 is a diagram illustrating a display device according to some example embodiments of the disclosure.

Referring to FIG. 1, the display device 100 may include a display panel 110 and a panel driver that drives the display panel 110.

The display panel 110 may include first to n-th scan lines SL1, SL2, . . . , and SLn and a common control line GC extending in a first direction, first to m-th data lines DL1 to DLm extending in a second direction crossing the first direction, the common control line GC, and a plurality of pixels, where n and m are natural numbers.

The pixels may be connected to a corresponding scan line among the first to n-th scan lines SL1 to SLn, a corresponding data line among the first to m-th data lines DL1 to DLm, and the common control line GC. Each pixel may emit light in response to a data voltage supplied through the corresponding data line, a scan signal supplied through the corresponding scan line, and a common control signal.

According to some example embodiments, the pixels may include a first pixel PX1 and a second pixel PX2.

According to some example embodiments, the first pixel PX1 and the second pixel PX2 may emit light with different colors.

According to some example embodiments, the first pixel PX1 may be connected to an i-th (where i is a natural number equal to or greater than 1 and equal to or less than n−1) scan line SLi among the first to n-th scan lines SL1, SL2, . . . , and SLn, and the common control line GC, and the second pixel PX2 may be connected to an (i+1)-th scan line SLi+1 among the first to n-th scan lines SL1, SL2, . . . , and SLn, and the common control line GC. The first and second pixels PX1 and PX2 may be connected to a j-th (where j is a natural number equal to or greater than 1 and equal to or less than m) data line DLj among the first to m-th data lines DL1, DL2, . . . , and DLm through a first capacitor Cpr. A structure of the first and second pixels PX1 and PX2 will be described in more detail later with reference to FIGS. 2 and 3.

The panel driver may drive the display panel 110 in a simultaneous (or concurrent) light emission method including a non-light emission period in which the pixels do not emit light and a light emission period in which the pixels emit light simultaneously (or concurrently). A driving method of the display panel 110 will be described in more detail later with reference to FIGS. 2, 3, 5, and 6.

According to some example embodiments, the panel driver may include a timing controller 120, a scan driver 130, a data driver 140, and a power supply 150.

The timing controller 120 may control the scan driver 130, the data driver 140, and the power supply 150. For example, the timing controller 120 may generate first to third control signals CTL1, CTL2, and CTL3 based on a control signal CTL provided from the outside (for example, a system board).

The timing controller 120 may provide the first control signal CTL1 to the scan driver 130. The first control signal CTL1 may include a vertical start signal, a scan clock signal, and the like.

The timing controller 120 may provide the second control signal CTL2 to the data driver 140. The second control signal CTL2 may include a horizontal start signal, a load signal, a data clock signal, a data signal, and the like.

The timing controller 120 may provide the third control signal CTL3 to the power supply 150. The third control signal CTL3 may include a switch control signal for controlling a voltage level of first power VDD, second power VSS, and third power VINT.

The scan driver 130 may generate scan signals and a common control signal based on the first control signal CTL1 provided from the timing controller 120, provide the scan signals to the first to n-th scan lines SL1, SL2, ..., and SLn, and provide the common control signal to the common control line GC.

According to some example embodiments, the scan driver 130 may simultaneously provide the scan signals and the common control signal having a pulse of a turn-on level (or a turn-on voltage level) to the first to n-th scan lines SL1, SL2, ..., and SLn and the common control line GC, and then may sequentially provide the scan signals having a pulse of a turn-on level to the first to n-th scan lines SL1, SL2, ..., and SLn.

The data driver 140 may generate data voltages based on the second control signal CTL2 provided from the timing controller 120. For example, the data driver 140 may generate the data voltages of an analog format based on the data signal of a digital format. The data driver 140 may provide the data voltages to the first to m-th data lines DL1, DL2, ..., and Dm.

The power supply 150 may provide the first power VDD, the second power VSS, and the third power VINT having a voltage level that varies within one frame period, based on the third control signal CNT3 to the pixels (for example, the first and second pixels PX1 and PX2). For example, the power supply 150 may include a DC-DC converter that generates output voltages having various voltage levels from an input voltage (for example, a battery voltage), and switches that selects the output voltages as the first power VDD, the second power VSS, and the third power VINT based on the third control signal CNT3 to set voltage levels for each of the first power VDD, the second power VSS, and the third power VINT.

Figure 2:
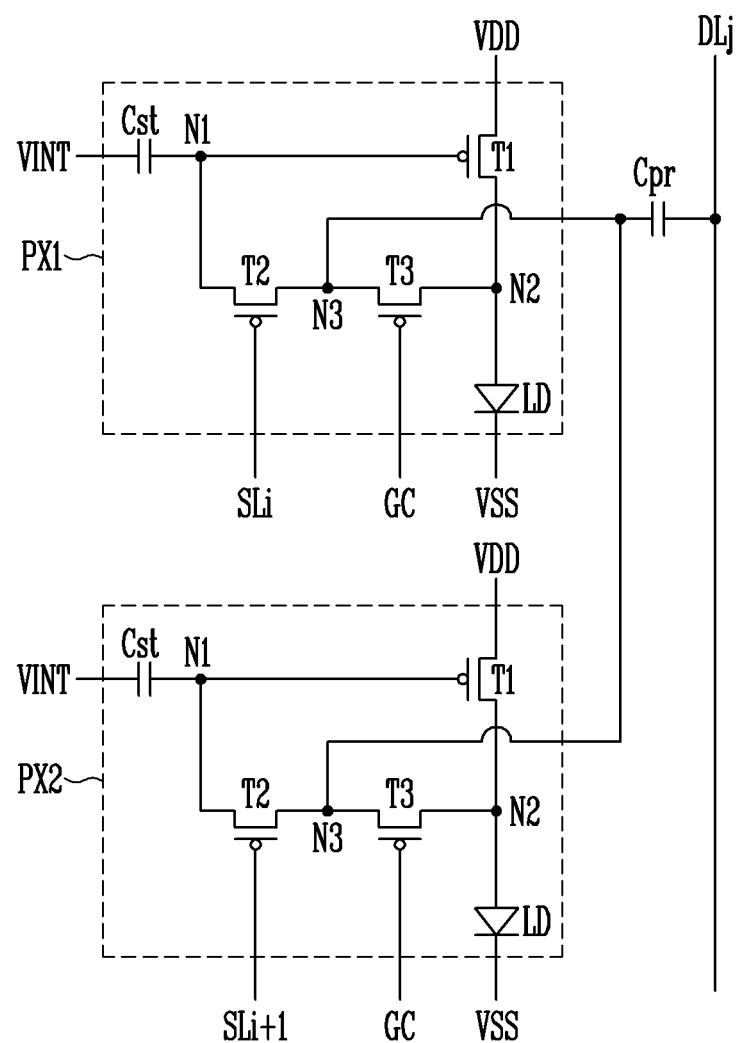
FIG. 2 is a circuit diagram illustrating an example of first and second pixels included in the display device of FIG. 1.

FIG. 2 is a circuit diagram illustrating an example of the first and second pixels included in the display device of FIG. 1. Although various electrical circuit components are illustrated in FIG. 2, embodiments according to the present invention may be modified without departing from the spirit and scope of the present invention. For example, according to some example embodiments, additional or fewer electrical circuit components may be included in the pixel circuit without departing from the spirit and scope of embodiments according to the present invention.

Referring to FIG. 2, each of the first and second pixels PX1 and PX2 may include first to third transistors T1, T2, and T3, a second capacitor Cst, and a light emitting element LD, and the first and second pixels PX1 and PX2 may share the first capacitor Cpr. According to some example embodiments, the first to third transistors T1, T2, and T3 included in each of the first and second pixels PX1 and PX2 may be P-type transistors, but embodiments are not limited thereto.

According to some example embodiments, the first pixel PX1 and the second pixel PX2 may be adjacent to each other in a direction in which the j-th data line DLj extends.

Here, at least one of the first to third transistors T1, T2, or T3 included in each of the first and second pixels PX1 and PX2 may be set as an oxide semiconductor thin film transistor including an active layer configured of an oxide semiconductor. However, embodiments according to the present disclosure are not limited thereto, and at least one of the first to third transistors T1, T2, or T3 included in each of the first and second pixels PX1 and PX2 may be set as an LTPS thin film transistor including an active layer configured of polysilicon.

Because the first pixel PX1 and the second pixel PX2 are substantially identical to each other, the first pixel PX1 will be described inclusive of the first pixel PX1 and the second pixel PX2.

In the first pixel PX1, a gate electrode of the first transistor T1 may be connected to a first node N1, a first electrode may be connected to the first power VDD, and a second electrode may be connected to a second node N2. The first transistor T1 may be referred to as a driving transistor.

A gate electrode of the second transistor T2 may be connected to the i-th scan line SLi, a first electrode may be connected to the first node N1, and a second electrode may be connected to a third node N3. The second transistor T2 may be referred to as a switching transistor, a scan transistor, or the like. The second transistor T2 may connect the first node N1 and the third node N3 to each other in response to an i-th scan signal having a pulse of a turn-on level provided from the i-th scan line SLi.

A gate electrode of the third transistor T3 may be connected to the common control line GC, a first electrode may be connected to the third node N3, and a second electrode may be connected to the second node N2. The third transistor T3 may connect the third node N3 and the second node N2 to each other in response to the common control signal having a pulse of a turn-on level provided from the common control line GC.

The second capacitor Cst may be positioned between the third power VINT and the first node N1. Here, the third power VINT may be an initialization power, may be controlled at a voltage level for initializing the pixel (for example, a first electrode of the light emitting element LD, a gate electrode of the first transistor T1, and the like) in an initialization period, and may be controlled at a voltage level at which a driving current is provided to the light emitting element LD in a light emission period. According to some example embodiments, a first electrode of the second capacitor Cst may be connected to the first node N1, and a second electrode may be connected to the third power VINT.

The first electrode of the light emitting element LD may be connected to the second node N2, and a second electrode may be connected to the second power VSS. For example, the first electrode of the light emitting element LD may be an anode electrode, and the second electrode may be a cathode electrode. The light emitting element LD may emit light based on a driving current flowing from the first transistor T1. The light emitting element LD may include an organic light emitting diode, an inorganic light emitting diode, or the like.

According to some example embodiments, the light emitting element LD may include a light emitting element capacitor connected in parallel with the light emitting element LD. For example, the light emitting element capacitor may be a parasitic capacitor.

Meanwhile, except for a configuration in which the gate electrode of the second transistor T2 is connected to the (i+1)-th scan line SLi+1 in the second pixel PX2, the second pixel PX2 is substantially the same as the first pixel PX1, and thus some repetitive description may be omitted.

The first capacitor Cpr may be connected to the j-th data line DLj, the first pixel PX1, and the second pixel PX2.

According to some example embodiments, the first capacitor Cpr may include a first electrode connected to the j-th data line DLj and, and a second electrode connected to the third node N3 of each of the first and second pixels PX1 and PX2.

As described with reference to FIG. 2, the first and second pixels PX1 and PX2 adjacent to each other may share the first capacitor Cpr connected to the j-th data line DLj. Meanwhile, there may be a restriction in reducing the area of the first electrode and the second electrode of the first capacitor Cpr due to a capacitance required for the first capacitor Cpr, and thus there may be a restriction in reducing the size of the pixels. When the first and second pixels PX1 and PX2 share the first capacitor Cpr, the restriction may be reduced and thus the size of the pixels may be further reduced. Therefore, a display panel of high resolution and high integration may be implemented.

Figure 3:
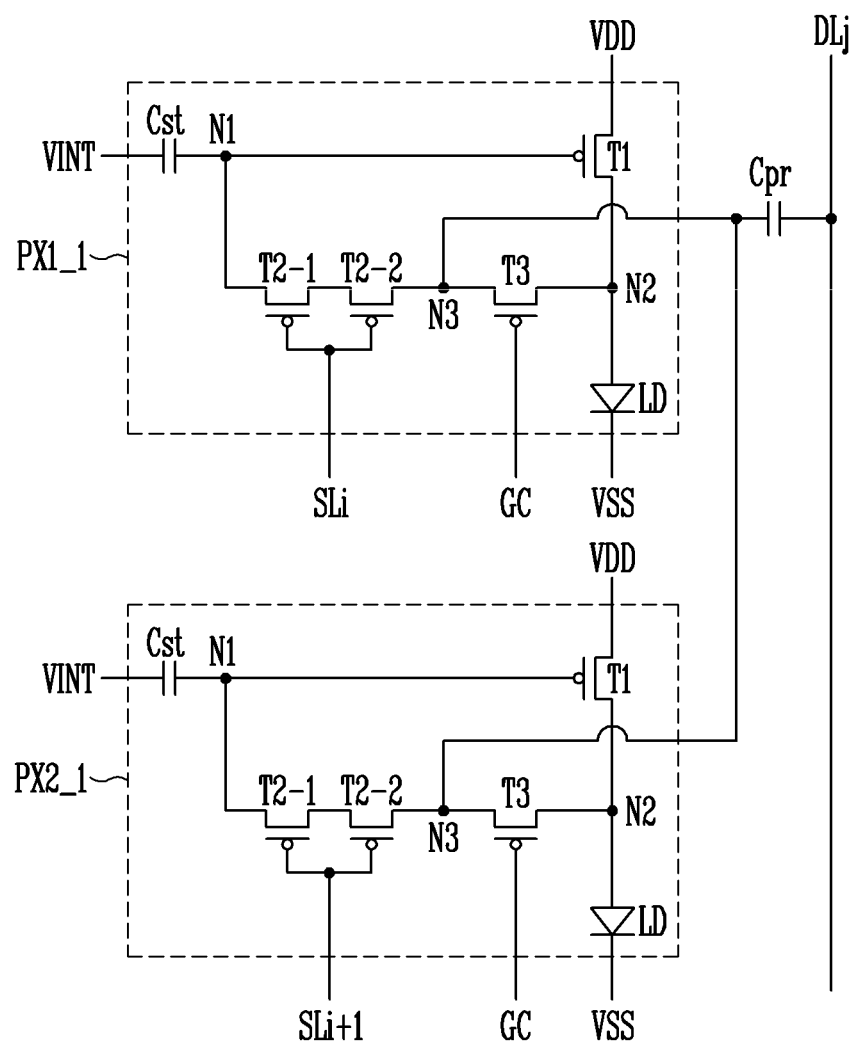
FIG. 3 is a circuit diagram illustrating another example of the first and second pixels included in the display device of FIG. 1.

FIG. 3 is a circuit diagram illustrating another example of the first and second pixels included in the display device of FIG. 1. Although various electrical circuit components are illustrated in FIG. 3, embodiments according to the present invention may be modified without departing from the spirit and scope of the present invention. For example, according to some example embodiments, additional or fewer electrical circuit components may be included in the pixel circuit without departing from the spirit and scope of embodiments according to the present invention.

Referring to FIGS. 2 and 3, except for a configuration in which the second transistor T2 is implemented as a dual gate transistor, the first and second pixels PX1_1 and PX2_1 of FIG. 3 are substantially the same as the first and second pixels PX1 and PX2 of FIG. 2, and thus some repetitive description may be omitted.

Referring to FIG. 3, the second transistor T2 included in the first and second pixels PX1_1 and PX2_1 may include a first sub transistor T2-1 and a second sub transistor T2-2. A first electrode of the first sub transistor T2-1 may be connected to the first node N1. A first electrode of the second sub transistor T2-2 may be connected to a second electrode of the first sub transistor T2-1, and a second electrode may be connected to the third node N3. In addition, gate electrodes of the first and second sub transistors T2-1 and T2-2 included in the first pixel PX1_1 may be connected to the i-th scan line SLi, and gate electrodes of the first and second sub transistors T2-1 and T2-2 included in the second pixel PX2_1 may be connected to the (i+1)-th scan line SLi+1.

As described with reference to FIG. 3, the second transistor T2 included in each of the first and second pixels PX1_1 and PX2_1 may be configured as the dual gate transistor (that is, the first and second sub transistors T2-1 and T2-2). In this case, a leakage current of the second transistor T2 may be reduced.

Figure 4:
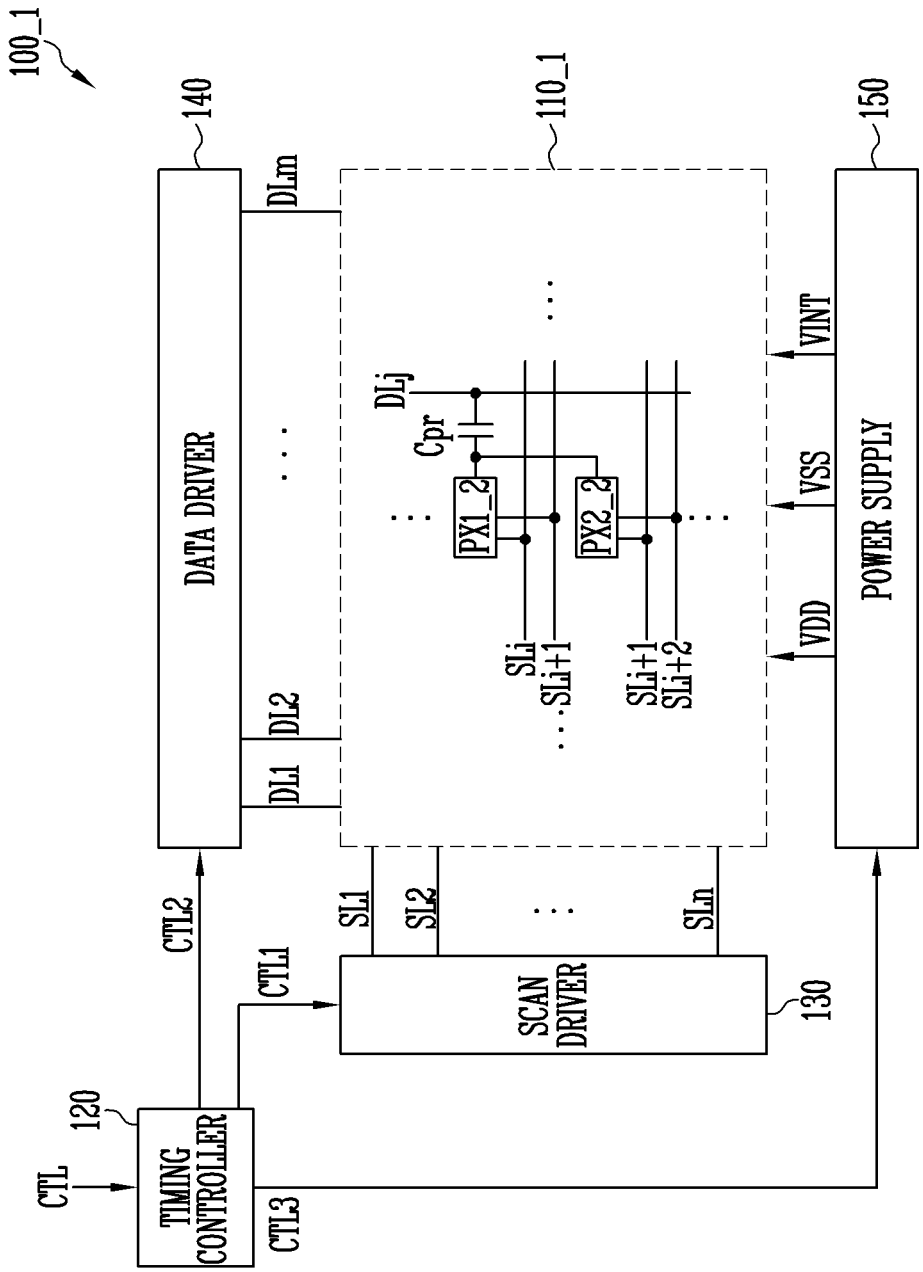
FIG. 4 is a diagram illustrating the display device according to some example embodiments of the disclosure.
Figure 5:
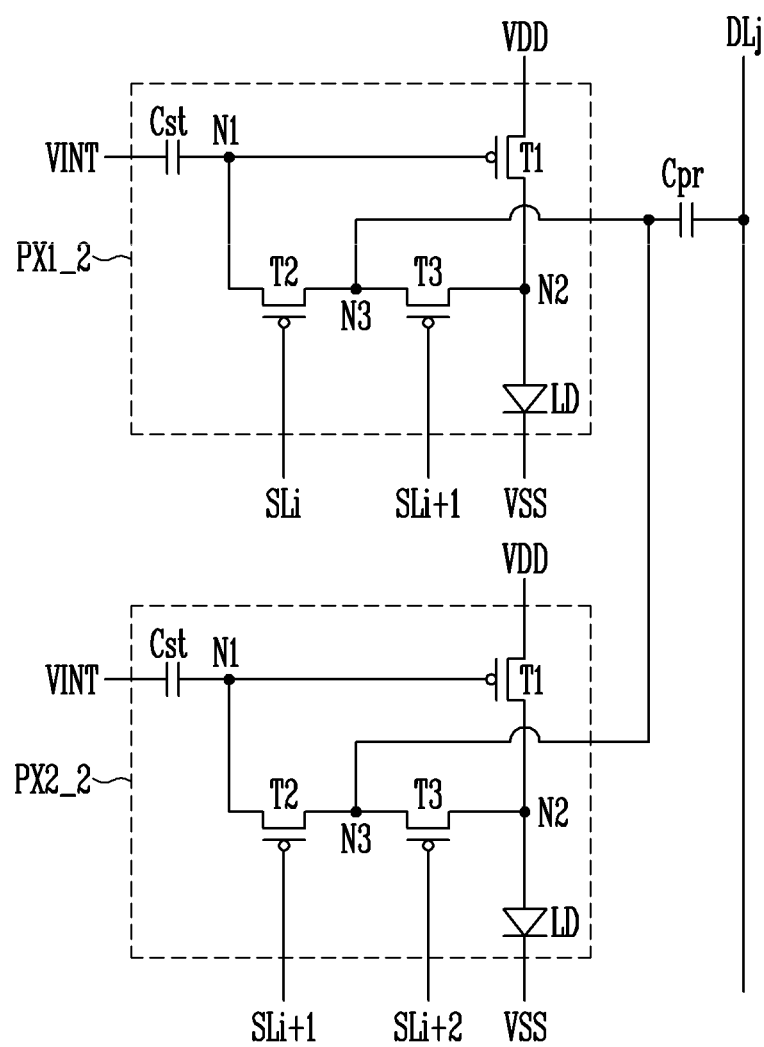
FIG. 5 is a circuit diagram illustrating an example of first and second pixels included in the display device of FIG. 4.

FIG. 4 is a diagram illustrating the display device according to some example embodiments of the disclosure, and FIG. 5 is a circuit diagram illustrating an example of first and second pixels included in the display device of FIG. 4. Although various electrical circuit components are illustrated in FIG. 5, embodiments according to the present invention may be modified without departing from the spirit and scope of the present invention. For example, according to some example embodiments, additional or fewer electrical circuit components may be included in the pixel circuit without departing from the spirit and scope of embodiments according to the present invention.

Referring to FIGS. 1 and 4, except for a connection configuration of first and second pixels PX1_2 and PX2_2 included in a display panel 110_1, the display device 100_1 of FIG. 4 is substantially the same as the display device 100 of FIG. 1, and thus some repetitive description may be omitted.

The display panel 110_1 may include the first pixel PX1_2 and the second pixel PX2_2.

The first pixel PX1_2 may be connected to an i-th (where i is a natural number equal to or greater than 1 and equal to or less than n−2) scan line SLi and an (i+1)-th scan line SLi+1 among the first to n-th scan lines SL1, SL2, . . . , and SLn, and the second pixel PX2_2 may be connected to the (i+1)-th scan line SLi+1 and an (i+2)-th scan line SLi+2. In this case, the display panel 110_1 may not include the common control line GC described with reference to FIG. 1.

Referring to FIGS. 2 and 5, except for a connection configuration of the third transistor T3 included in the first and second pixels PX1_2 and PX2_2 of FIG. 5, the first and second pixels PX1_2 and PX2_2 of FIG. 3 are substantially the same as the first and second pixels PX1 and PX2 of FIG. 2, and thus some repetitive description may be omitted.

Referring to FIG. 5, a gate electrode of the third transistor T3 included in the first pixel PX1_2 may be connected to the (i+1)-th scan line SLi+1, and a gate electrode of the third transistor T3 included in the second pixel PX2_2 may be connected to the (i+2)-th scan line SLi+2. Each of the third transistors T3 included in the first and second pixels PX1_2 and PX2_2 may connect the third node N3 and the second node N2 to each other in response to respective scan signals having a pulse of a turn-on level provided from the respective (i+1)-th and (i+2)-th scan lines SLi+1 and SLi+2.

As described with reference to FIGS. 4 and 5, the gate electrodes of the third transistors T3 included in the first and second pixels PX1_2 and PX2_2 are connected to the scan lines, and thus the display panel 110_1 may not include a separate line (for example, the common control line GC (refer to FIG. 1). Therefore, the display panel having a relatively high resolution and high integration may be implemented.

Figure 6:
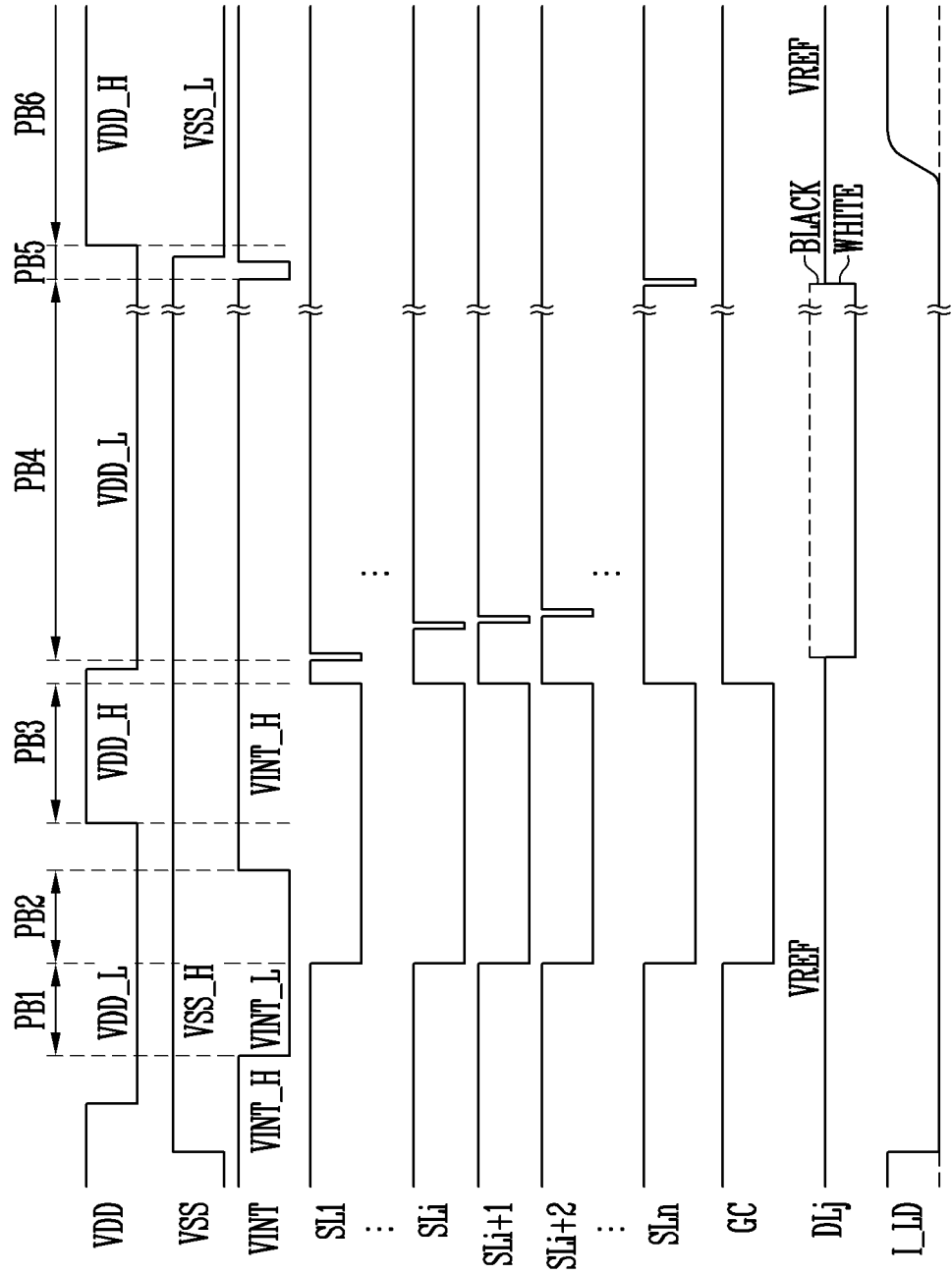
FIG. 6 is a waveform diagram illustrating a driving method of the first and second pixels of FIGS. 2, 3, and 5.

FIG. 6 is a waveform diagram illustrating a driving method of the first and second pixels of FIGS. 2, 3, and 5.

Referring to FIGS. 1, 2, and 6, the panel driver (for example, the timing controller 120, the scan driver 130, the data driver 140, and the power supply 150) may drive the display panel in a simultaneous light emission method. When the display panel is driven in the simultaneous light emission method, one frame period may include a non-light emission period PB1 to PB5 in which the pixels (for example, the first and second pixels PX1 and PX2) do not emit light and a light emission period PB6 in which the pixels PX1 and PX2 simultaneously emit light. The non-light emission periods PB1 to PB5 may include a first initialization period PB1, a second initialization period PB2, a threshold voltage compensation period PB3, a data writing period PB4, and a third initialization period PB5.

In the first initialization period PB1, a voltage of the first electrode (for example, the anode electrode) of the light emitting element LD may be initialized. In the second initialization period PB2 after the first initialization period PB1, the gate electrode of the first transistor T1 may be initialized. In the threshold voltage compensation period PB3 after the second initialization period PB2, the first transistor T1 may be diode-connected. In the data writing period PB4 after the threshold voltage compensation period PB3, the data voltage provided from the j-th data line DLj may be written to the pixels PX1 and PX2. In the third initialization period PB5 after the data writing period PB4, the voltage of the first electrode of the light emitting element LD may be initialized.

The first power VDD, the second power VSS, and the third power VINT may have voltage levels (for example, AC voltages) that vary within one frame period. For example, the first power VDD may have a first voltage level VDD_L or a second voltage level VDD_H greater than the first voltage level VDD_L. The second power VSS may have a third voltage level VSS_L or a fourth voltage level VSS_H greater than the third voltage level VSS_L. The third power VINT may have a fifth voltage level VINT_L or a sixth voltage level VINT_H greater than the fifth voltage level VINT_L. In addition, a reference voltage VREF may be applied to the j-th data line DLj except for the data writing period PB4, and the data voltage for expressing a grayscale may be provided to the j-th data line DLj in the data writing period PB4.

In the first initialization period PB1, the first power VDD may have the first voltage level VDD_L, the second power VSS may have the fourth voltage level VSS_H, the third power VINT may have the fifth voltage level VINT_L, and each of first to n-th scan signals provided to the first to n-th scan lines SL1 to SLn and each of common control signals provided to the common control line GC may have a turn-off level (or turn-off voltage level). Therefore, a current may flow from the second node N2 to the first power VDD through the first transistor T1, and a voltage of the second node N2 may be set to the first voltage level VDD_L. That is, a voltage of the first electrode of the light emitting element LD may be initialized.

In the second initialization period PB2, the first to n-th scan signals provided to the first to n-th scan lines SL1 to SLn and the common control signal provided to the common control line GC may have a turn-on level (or turn-on voltage level). Therefore, the second and third transistors T2 and T3 may be turned on, and the gate electrode (that is, the first node N1) and the second electrode (that is, the second node N2) of the first transistor T1 share a charge by the turned on second and third transistors T2 and T3. Therefore, a voltage of the first electrode of the light emitting element LD and a voltage of the gate electrode of the first transistor T1 may be initialized.

In the threshold voltage compensation period PB3, the first power VDD may have the second voltage level VDD_H, and the third power VINT may have the sixth voltage level VINT_H. Therefore, the gate electrode and the second electrode of the first transistor T1 may be diode-connected by the turned-on second and third transistors T2 and T3, and the voltage of the first node and the voltage of the second node may be set as a voltage to which a threshold voltage Vth of the first transistor T1 is applied to the second voltage level VDD_H.

In the data writing period PB4, the first power VDD may have the first voltage level VDD_L, and the first to n-th scan signals having turn-on levels may be sequentially provided to the first to n-th scan lines SLi to SLn. Therefore, the respective second transistors T2 may be turned on by the respective scan signals having the turn-on level, and data voltages may be written to the pixels. Referring to FIG. 2, for example, when an i-th scan signal having a turn-on level is provided to the gate electrode of the second transistor T2 included in the first pixel PX1 through the i-th scan line SLi, the second transistor T2 may be turned on and thus the data voltage provided through the j-th data line DLj may be written to the first pixel PX1. Thereafter, when an (i+1)-th scan signal having a turn-on level is provided to the gate electrode of the second transistor T2 included in the second pixel PX2 through the (i+1)-th scan line SLi+1, the second transistor T2 may be turned on and thus the data voltage provided through the j-th data line DLj may be written to the second pixel PX2. In this case, since the second transistors T2 included in the first and second pixels PX1 and PX2 are turned on when the scan signals are respectively applied through the scan lines (that is, the i-th scan line SLi and the (i+1)-th scan line SLi+1) respectively connected to the second transistors T2, even though the first and second pixels PX1 and PX2 share the first capacitor Cpr, the data voltages may be normally written to the first pixel PX1 and the second pixel PX2 through the data line DLj.

Meanwhile, the third transistor T3 is positioned between the second node N2 and the third node N3, and thus the second node N2 and the third node N3 may be separated from each other by the turned off third transistor T3. Therefore, even though a leakage current flowing from the power VDD to the second node N2 through the first transistor T1 occurs while the data voltage is written to the gate electrode (that is, the first node N1) of the first transistor T1 through the data line (that is, the j-th data line DLj), since the data voltage written to the gate electrode of the first transistor T1 is not affected, display quality may be improved.

In the third initialization period PB5, the third power VINT may be changed from the sixth voltage level VINT_H to the fifth voltage level VINT_L, and may be changed from the fifth voltage level VINT_L to the sixth voltage level VINT_H again.

That is, since the third power VINT swings, the voltage of the first electrode of the light emitting element LD may be initialized to the first voltage level VDD_L, a margin for expressing a black grayscale may be secured, and display quality may be improved.

In the light emission period PB6, the first power VDD may have the second voltage level VDD_H, and the second power VSS may have the third voltage level VSS_L. That is, in the light emission period PB6, a driving current I_LD is generated according to a voltage difference between the gate electrode and a source electrode (that is, the first electrode) of the first transistor T1, and the driving current I_LD flows to the element LD through the first transistor T1. Therefore, the PX1 and PX2 may emit light simultaneously.

FIG. 6 shows an example in which the pixels PX1 and PX2 are driven using the first power VDD, the second power VSS, and the third power VINT having a voltage level that varies within one frame period. However, embodiments according to the disclosure are not limited thereto, and the pixels PX1 and PX2 may be driven in various methods.

As described with reference to FIGS. 1 to 6, even though the first and second pixels PX1 and PX2 share the first capacitor Cpr connected to the data line to provide the data voltages, the data voltages may be independently written to the first pixel PX1 and the second pixel PX2 through the data line in the data writing period PB4, and the pixels PX1 and PX2 may emit light with luminances corresponding to the data voltages.

Figure 7:
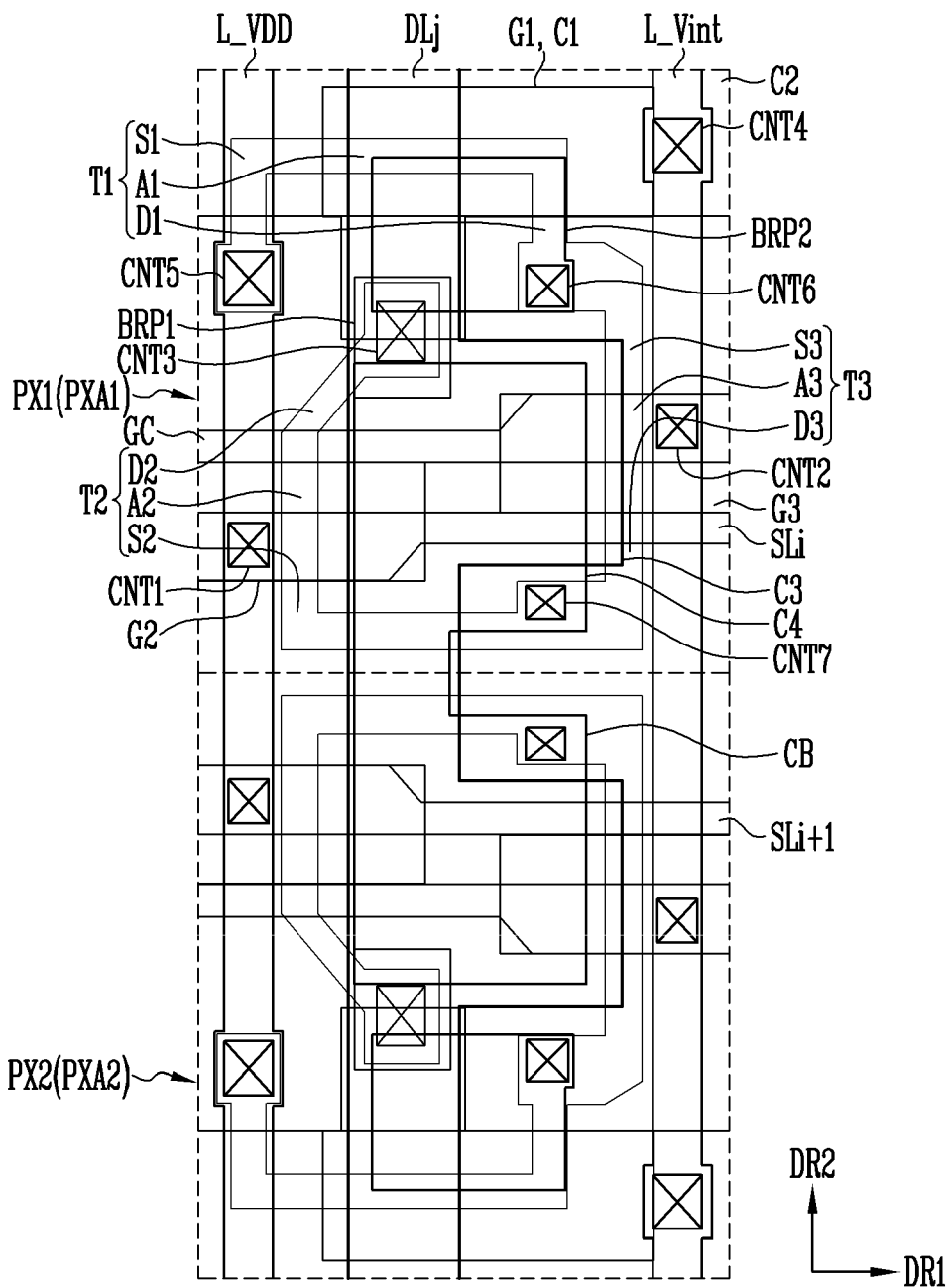
FIG. 7 is a layout diagram of the first and second pixels of FIG. 2.

FIG. 7 is a layout diagram of the first and second pixels of FIG. 2, and FIGS. 8A to 8E are layout diagrams of a semiconductor layer, a first conductive layer, a second conductive layer, a third conductive layer, and a fourth conductive layer included in the first and second pixels of FIG. 7. Each of FIGS. 8A to 8E shows an arrangement of a line, an electrode, a semiconductor pattern, and the like located in the same layer.

Referring to FIGS. 2 and 7, the display panel 110 (refer to FIG. 1) may include a first pixel area PXA1 and a second pixel area PXA2. The first pixel PX1 may be provided in the first pixel area PXA1, and the second pixel PX2 may be provided in the second pixel area PXA2.

According to some example embodiments, the first pixel area PXA1 and the second pixel area PXA2 may be adjacent to each other along the second direction DR2, which is a direction in which the j-th data line DLj extends.

The first pixel PX1 and the second pixel PX2 may be symmetrical based on a boundary line to which the first pixel area PXA1 and the second pixel area PXA2 are adjacent. Therefore, the first pixel PX1 and the second pixel PX2 include substantially similar or the same configuration. Thus, hereinafter, the description will be given based on the first pixel PX1. In a case of the second pixel PX2, some repetitive description of the configuration substantially the same as the configuration included in the first pixel PX1 may be omitted.

The first pixel PX1 may include a substrate, and the semiconductor layer the first conductive layer, the second conductive layer, the third conductive layer, and the fourth conductive layer, which are shown in FIGS. 8A to 8E. An insulating layer may be interposed between the semiconductor layer and the first to fourth conductive layers. For example, a gate insulating layer may be interposed between the semiconductor layer shown in FIG. 8A and the first conductive layer shown in FIG. 8B, and each of interlayer insulating layers may be interposed between the first to fourth conductive layers shown in FIGS. 8B to 8E. Each of the gate insulating layer and the interlayer insulating layers may include an inorganic material including an oxide or a nitride. For example, the gate insulating layer and the interlayer insulating layer may include silicon oxide (SiO2), silicon nitride (SiNx), silicon oxynitride (SiON), or the like.

Figure 8A:
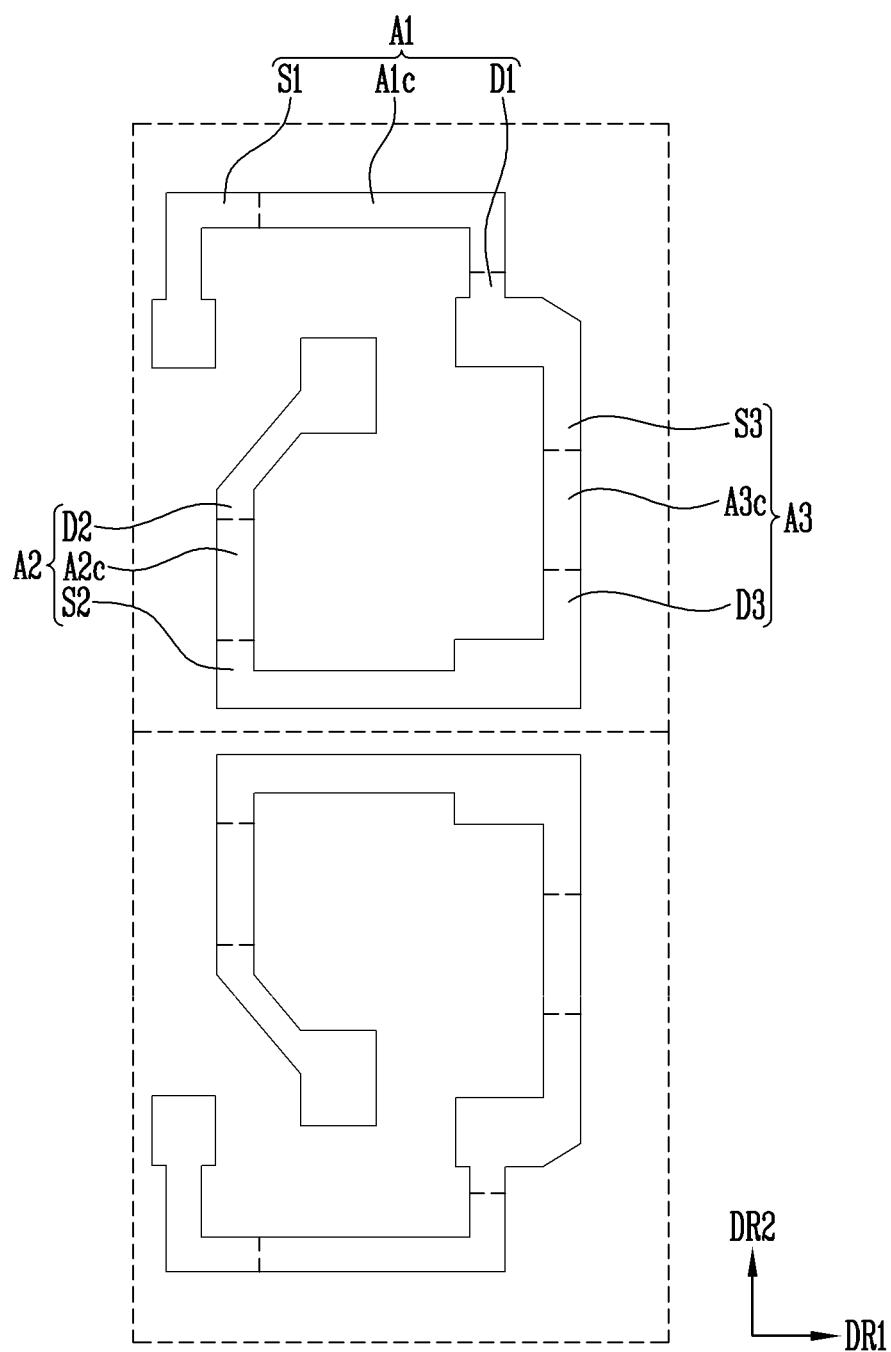
FIGS. 8A to 8E are layout diagrams of a semiconductor layer, a first conductive layer, a second conductive layer, a third conductive layer, and a fourth conductive layer included in the first and second pixels of FIG. 7.

Referring to FIGS. 2, 7, and 8A, the semiconductor layer may be located on the substrate, may be provided in the first pixel area PXA1 of the substrate, and may include first to third semiconductor patterns A1, A2, and A3. The first to third semiconductor patterns A1, A2, and A3 may configure the first transistor T1, the second transistor T2, and the third transistor T3, respectively. The first to third semiconductor patterns A1, A2, and A3 may include the same material. For example, the first to third semiconductor patterns A1, A2, and A3 may be formed of polycrystalline silicon.

The first semiconductor pattern A1, the second semiconductor pattern A2, and the third semiconductor pattern A3 may be connected to each other, and may be bent in various shapes.

The first to third semiconductor patterns A1, A2, and A3 may include a channel region, and a source region and a drain region on both sides of the channel region. For example, the source region and the drain region may be doped with an impurity, and the impurity may include a P-type impurity, but embodiments according to the present disclosure are not limited thereto, and may include, for example, an N-type impurity. The source region and the drain region may correspond to a source electrode and a drain electrode, respectively. Hereinafter, the terms source region and drain region are used instead of the source electrode or the drain electrode.

The first semiconductor pattern A1 may include a first channel region A1c, and a first source region S1 and a first drain region D1 on both sides of the first channel region A1c. The first semiconductor pattern A1 may be formed to be most spaced apart from the second pixel area PXA2 in the first pixel area PXA1. The first source region S1 may extend in the second direction DR2, the first channel region A1c connected to the first source region S1 may extend in the first direction DR1, and the first drain region D1 connected to the first channel region A1c may extend in the second direction DR2. The first semiconductor pattern A1 may have a bent shape, and thus the first channel region A1c may be formed to be longer than the other channel regions A2c and A3c. For example, the first semiconductor pattern A1 may have a long channel length in a narrow space by having a shape that is bent a plurality of times such as an omega or an alphabet "S". Because the first channel region A1c is formed to be long, a driving range of a gate voltage applied to a first gate electrode G1 is widened. Therefore, a grayscale of the light emitted from the light emitting element LD may be more precisely controlled, and the display quality may be relatively improved. Meanwhile, the first drain region D1 of the first semiconductor pattern A1 may be connected to a source region S3 of the third semiconductor pattern A3.

The second semiconductor pattern A2 may include a second channel region A2c, and a second source region S2 and a second drain region D2 on both sides of the second channel region A2c. The second source region S2 of the second semiconductor pattern A2 may be connected to a third drain region D3 of the third semiconductor pattern A3. The second source region S2 may extend in the first direction DR1, the second channel region A2c connected to the second source region S2 may extend in the second direction DR2, and the second drain region D2 connected to the second channel region A2c may extend to a center portion of the first pixel area PXA1.

The third semiconductor pattern A3 may include a third channel region A3c, and the third source region S3 and the third drain region D3 on both sides of the third channel region A3c. The third semiconductor pattern A3 may be located between the first semiconductor pattern A1 and the second semiconductor pattern A2 to connect the first semiconductor pattern A1 and the second semiconductor pattern A2. The third source region S3 of the third semiconductor pattern A3 may be connected to the first drain region D1, and the third drain region D3 of the third semiconductor pattern A3 may be connected to the second source region S2. The third source region S3 may be connected to the first drain region D1 and may extend in the second direction DR2. The third channel region A3c connected to the third source region S3 may extend in the second direction DR2. The third drain region D3 connected to the third channel region A3c may extend in the first direction DR1 to be connected to the second source region S2.

Figure 8B:
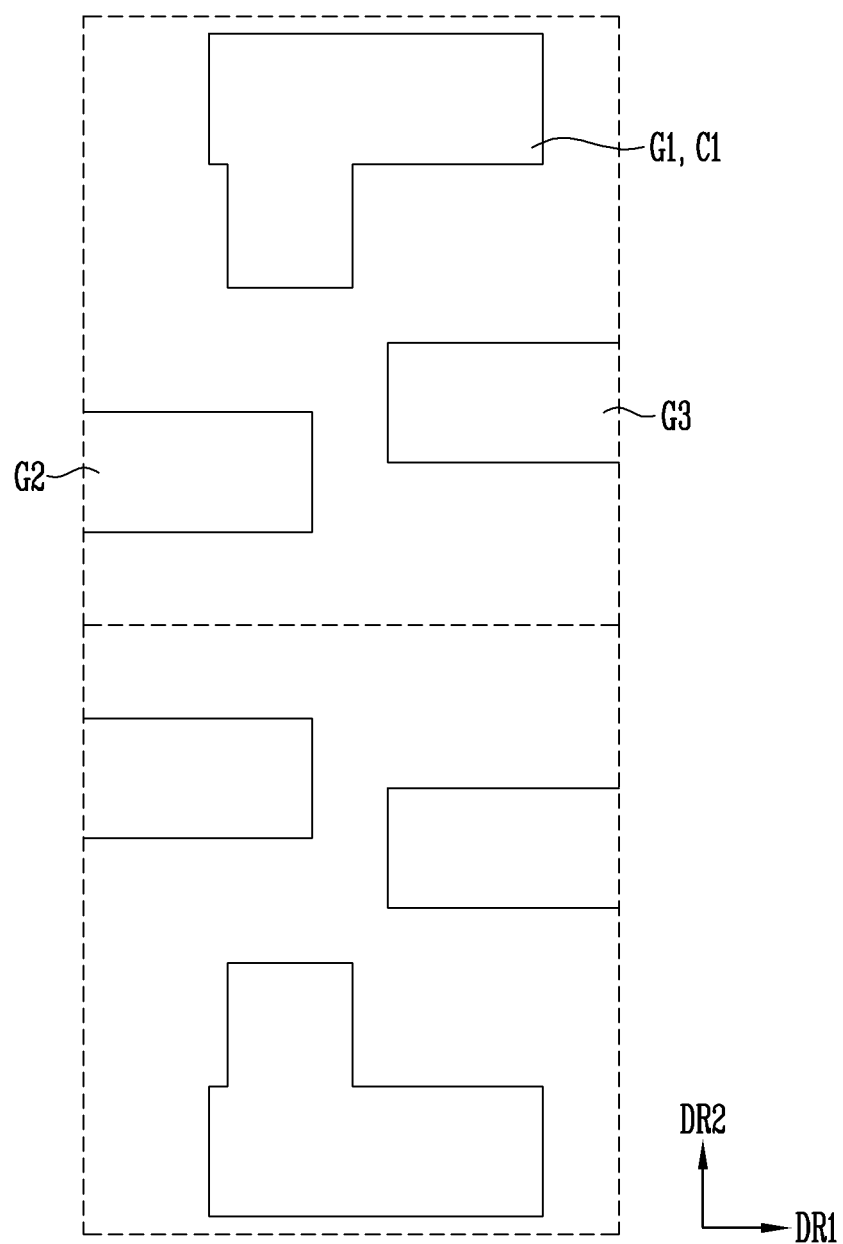

Referring to FIGS. 2, 7, and 8B, the first conductive layer may be located on the semiconductor layer of FIG. 8A, and the first conductive layer may include the first gate electrode G1, a second gate electrode G2, and a third gate electrode G3. The first gate electrode G1, the second gate electrode G2, and the third gate electrode G3 may include the same material. For example, the first gate electrode G1, the second gate electrode G2, and the third gate electrode G3 may include molybdenum (Mo), aluminum (Al), copper (Cu), titanium (Ti), and the like, and may be formed as a single layer or multiple layers.

The first gate electrode G1, the second gate electrode G2, and the third gate electrode G3 may respectively overlap the channel regions of the first semiconductor pattern A1, the second semiconductor pattern A2, and the third semiconductor pattern A3 described with reference to FIG. 8A, as an island shape. The first gate electrode G1 may perform not only a function as the gate electrode of the first transistor T1, but also a function of a first electrode C1, which is a lower electrode of the second capacitor Cst. That is, the first gate electrode G1 and the first electrode C1, which is the lower electrode of the second capacitor Cst, may be integrally formed. That is, the first gate electrode G1 may overlap a second electrode C2, which is an upper electrode of the second capacitor Cst, and thus a portion of the first gate electrode G1 may configure the first electrode C1, which is the lower electrode of the second capacitor Cst. Since the first gate electrode G1 and the first electrode C1, which is the lower electrode of the second capacitor Cst, are integrally formed, the first gate electrode G1 and the second capacitor Cst are formed to overlap each other. Therefore, high integration may be possible.

Figure 8C:
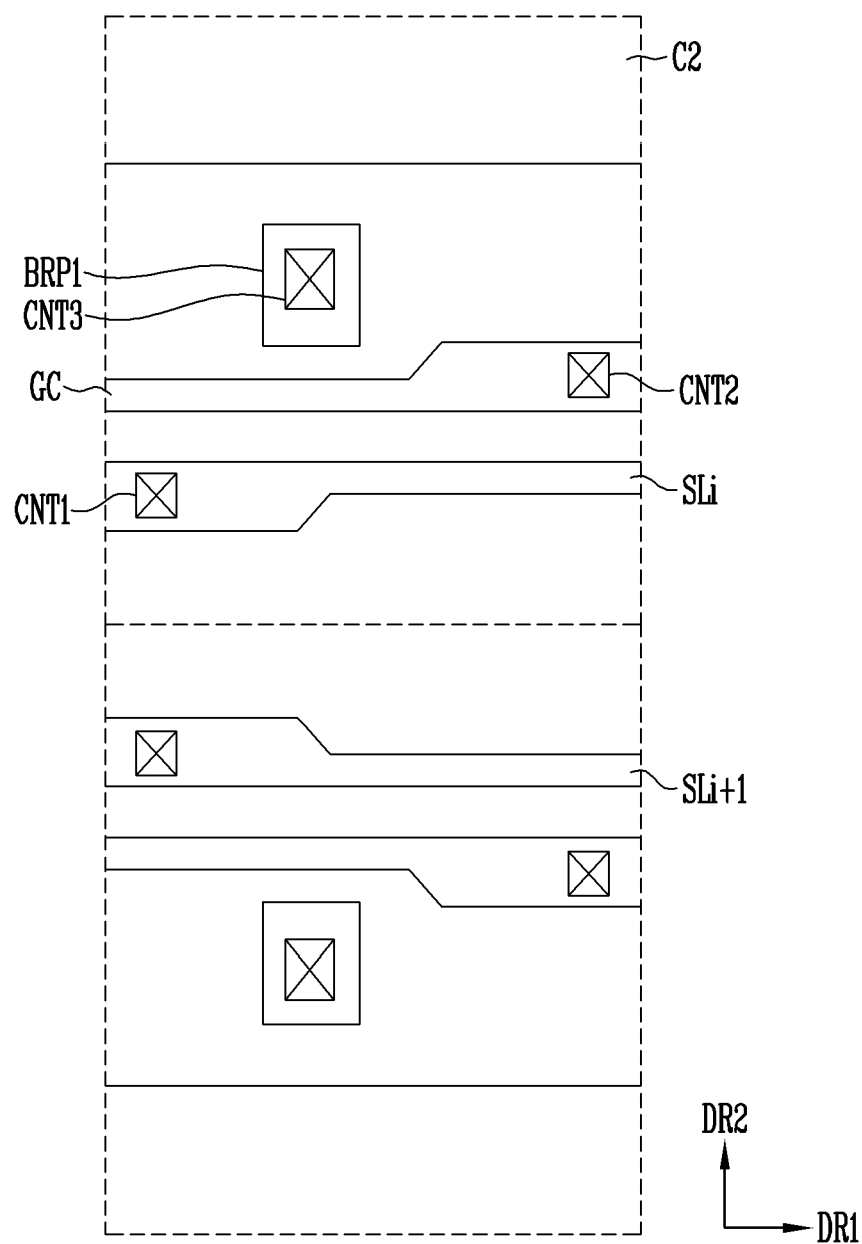

Referring to FIGS. 2, 7, and 8C, the second conductive layer may be located on the first conductive layer of FIG. 8B, and the second conductive layer may include the i-th scan line SLi, the common control line GC, the second electrode C2, which is the upper electrode of the second capacitor Cst, and a first bridge pattern BRP1. The i-th scan line SLi, the common control line GC, the second electrode C2, which is the upper electrode of the second capacitor Cst, and the first bridge pattern BRP1 may include the same material. For example, the i-th scan line SLi, the common control line GC, the second electrode C2, which is the upper electrode of the second capacitor Cst, and the first bridge pattern BRP1 may include molybdenum (Mo), aluminum (Al), copper (Cu), titanium (Ti), and the like, and may be formed of a single layer or multiple layers. Meanwhile, the second conductive layer provided on the second pixel area PXA2 may include the (i+1)-th scan line SLi+1 instead of the i-th scan line SLi.

A portion of the i-th scan line SLi may overlap the second gate electrode G2 described with reference to FIG. 8B and may be connected to the second gate electrode G2 by a first contact hole CNT1. A portion of the common control line GC may overlap the third gate electrode G3, and the common control line GC may be connected to the third gate electrode G3 by a second contact hole CNT2. The first bridge pattern BRP1 may be formed in an island shape, and overlap the second drain region D2 of the second semiconductor pattern A2 to be connected to the second drain region D2 of the second semiconductor pattern A2 and the first gate electrode G1 by a third contact hole CNT3.

The second electrode C2, which is the upper electrode of the second capacitor Cst, may extend in the first direction DR1, may extend to neighboring pixels, and may be arranged to overlap the first electrode C1, which is the lower electrode of the second capacitor Cst, (or the first gate electrode G1). A capacitance of the second capacitor Cst may be determined by the area at which the first electrode C1 and the second electrode C2 overlap each other, a dielectric constant of a dielectric layer located between the first electrode C1 and the second electrode C2, and the like.

Figure 8D:
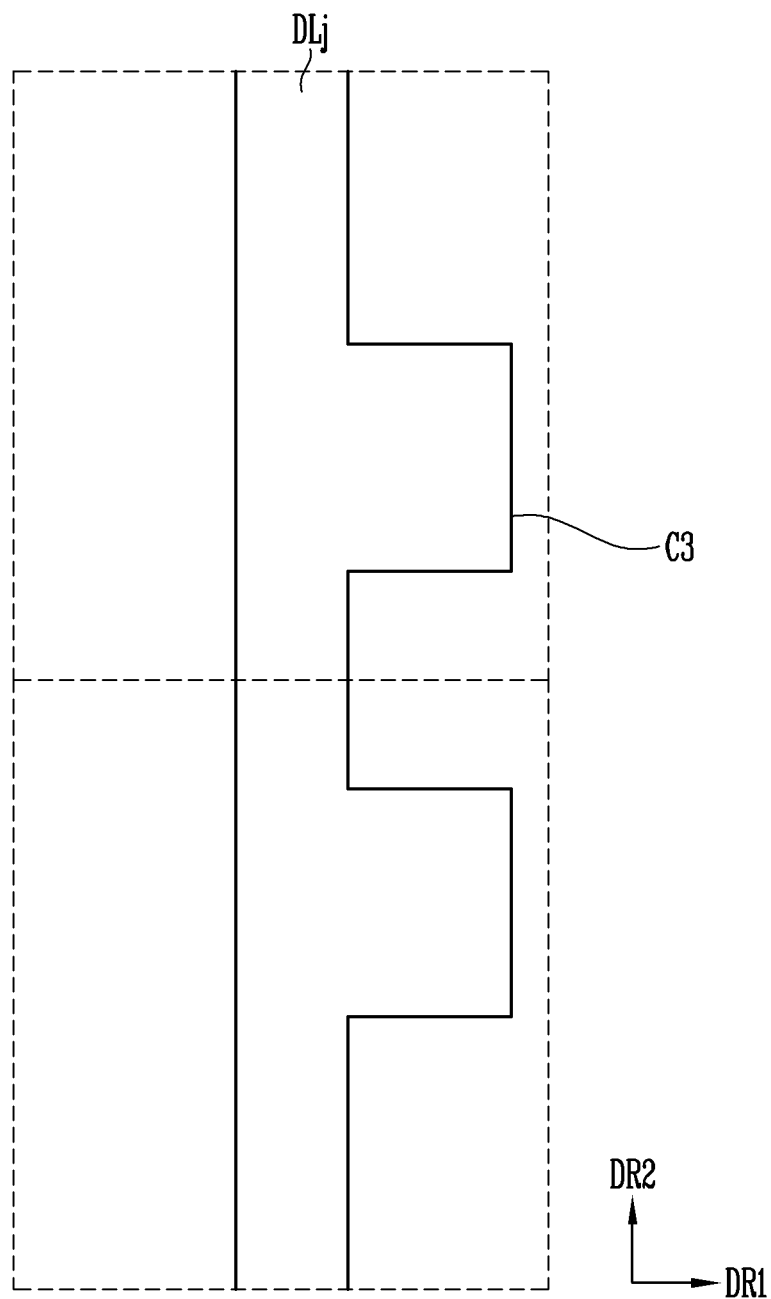

Referring to FIGS. 2, 7, and 8D, the third conductive layer may be located on the second conductive layer of FIG. 8C, and the third conductive layer may include the j-th data line DLj extending in the second direction DR2 and a third electrode C3, which is a lower electrode of the first capacitor Cpr. A portion or protruded portions of the j-th data line DLj may configure the third electrode C3, which is the lower electrode of the first capacitor Cpr.

The j-th data line DLj may extend across the first and second pixel areas PXA1 and PXA2 in the second direction DR2, and may include a portion protruded in the first direction DR1 in each of the first and second pixel areas PXA1 and PXA2.

The j-th data line DLj may include a conductive material including molybdenum (Mo), aluminum (Al), copper (Cu), titanium (Ti), and the like, and may be formed of multiple layers or a single layer including the above-described materials. For example, the j-th data line DLj may be formed of a multilayer structure of Ti/Al/Ti.

Figure 8E:
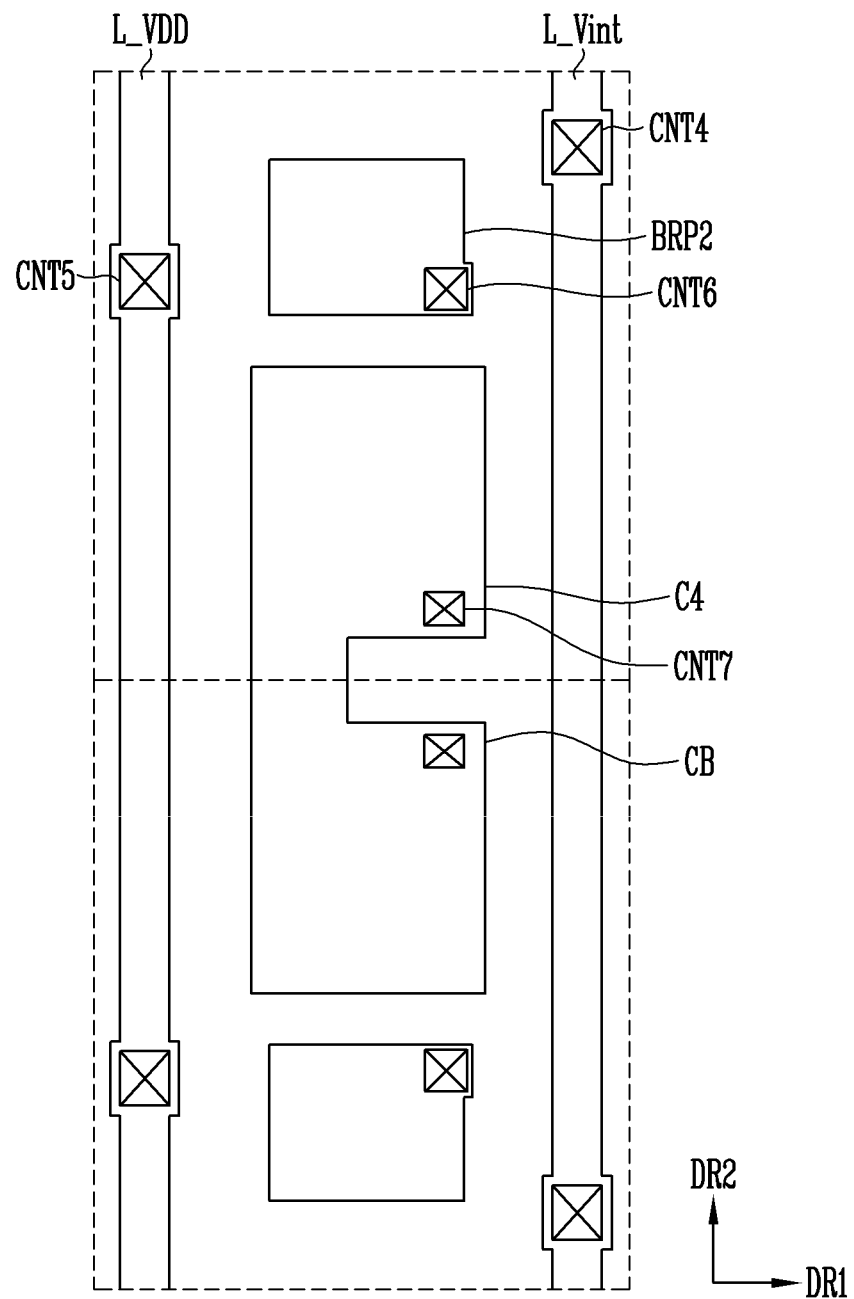

Referring to FIGS. 2, 7, and 8E, the fourth conductive layer may be located on the third conductive layer of FIG. 8D, and the fourth conductive layer may include a driving power line L_VDD (or a line of the first power VDD), an initialization power line L_Vint (or a line of the third power VINT), a second bridge pattern BRP2, and a fourth electrode C4, which is an upper electrode of the first capacitor Cpr.

The driving power line L_VDD, the initialization power line L_Vint, the second bridge pattern BRP2, and the fourth electrode C4, which is the upper electrode of the first capacitor Cpr, may include the same material. For example, the driving power line L_VDD, the initialization power line L_Vint, the second bridge pattern BRP2, and the fourth electrode C4, which is the upper electrode of the first capacitor Cpr, may include a conductive material including molybdenum (Mo), aluminum (Al), copper (Cu), titanium (Ti), and the like, and may be formed of a multilayer or a single layer including the above-described materials. For example, the driving power line L_VDD, the initialization power line L_Vint, the second bridge pattern BRP2, and the fourth electrode C4, which is the upper electrode of the first capacitor Cpr, may be formed of a multilayer structure of Ti/Al/Ti.

The initialization power line L_Vint and the driving power line L_VDD may extend across the first and second pixel areas PXA1 and PXA2 in the second direction DR2.

A portion of the initialization power line L_Vint may overlap a portion of the second electrode C2, which is the upper electrode of the second capacitor Cst, and thus the initialization power line L_Vint may be connected to (or in contact with) the second capacitor, which is the upper electrode of the second capacitor Cst, through a fourth contact hole CNT4. A portion of the driving power line L_VDD may overlap the first source region S1 of the first transistor T1, and thus the driving power line L_VDD may be connected to the first source region S1 of the first transistor T1 through a fifth contact hole CNT5. The second bridge pattern BRP2 may overlap the first drain region D1 of the first transistor T1, and thus the second bridge pattern BRP2 may be connected to the first drain region D1 of the first transistor T1 through a sixth contact hole CNT6. In addition, the second bridge pattern BRP2 may be connected to the first electrode of the light emitting element LD. That is, the first drain region D1 of the first transistor T1 and the first electrode of the light emitting element LD may be connected to each other through the second bridge pattern BRP2.

The fourth electrode C4, which is the upper electrode of the first capacitor Cpr, may overlap the source region S2 of the second transistor T2 and the drain region D3 of the third transistor T3, and thus fourth electrode C4, which is the upper electrode of the first capacitor Cpr, may be connected to the source region S2 of the second transistor T2 and the drain region D3 of the third transistor T3 through a seventh contact hole CNT7. In this case, the fourth electrode C4, which is the upper electrode of the first capacitor Cpr, may be connected to the source region S2 of the second transistor T2 and the drain region D3 of the third transistor T3 of each of the first and second pixels PX1 and PX2.

The fourth electrode C4, which is the upper electrode of the first capacitor Cpr, may be formed over the first and second pixel areas PXA1 and PXA2. The fourth electrode C4, which is the upper electrode of the first capacitor Cpr, may overlap the portion or the protruded portion of the j-th data line configuring the third electrode C3, which is the lower electrode of the first capacitor Cpr, to form the first capacitor Cpr.

In this case, the third and fourth electrodes C3 and C4 are formed over the first and second pixel areas PXA1 and PXA2, and thus the first and second pixels PX1 and PX2 may share the first capacitor Cpr formed by the third and fourth electrodes C3 and C4.

As described with reference to FIGS. 2, 7, and 8A to 8E, the first and second pixels PX1 and PX2 are symmetrical with respect to the boundary line to which the first pixel area PXA1 and the second pixel area PXA2 are adjacent, the first capacitor Cpr may be formed in an area to which the first pixel area PXA1 and the second pixel area PXA2 are adjacent, and thus the first and second pixels PX1 and PX2 may share the first capacitor Cpr. That is, the area of the fourth electrode C4, which is the upper electrode of the first capacitor Cpr, for configuring the capacitance required for the first capacitor Cpr may be formed over the first and second pixel areas PXA1 and PXA2. Therefore, the area of the fourth electrode C4 of the first capacitor Cpr required for the first and second pixel areas PXA1 and PXA2 may be reduced, and thus the entire area of the first and second pixel areas PXA1 and PXA2 may be reduced. Thus, the display panel of high resolution and high integration may be implemented.

Alternatively, the fourth electrode C4 of the first capacitor Cpr may be formed over the first and second pixel areas PXA1 and PXA2 while maintaining the area of the fourth electrode C4 of the first capacitor Cpr required for the first and second pixel areas PXA1 and PXA2. Therefore, the capacitance of the first capacitor Cpr may be improved by largely forming the third electrode C3 and the fourth electrode C4 of the first capacitor Cpr.

Figure 9:
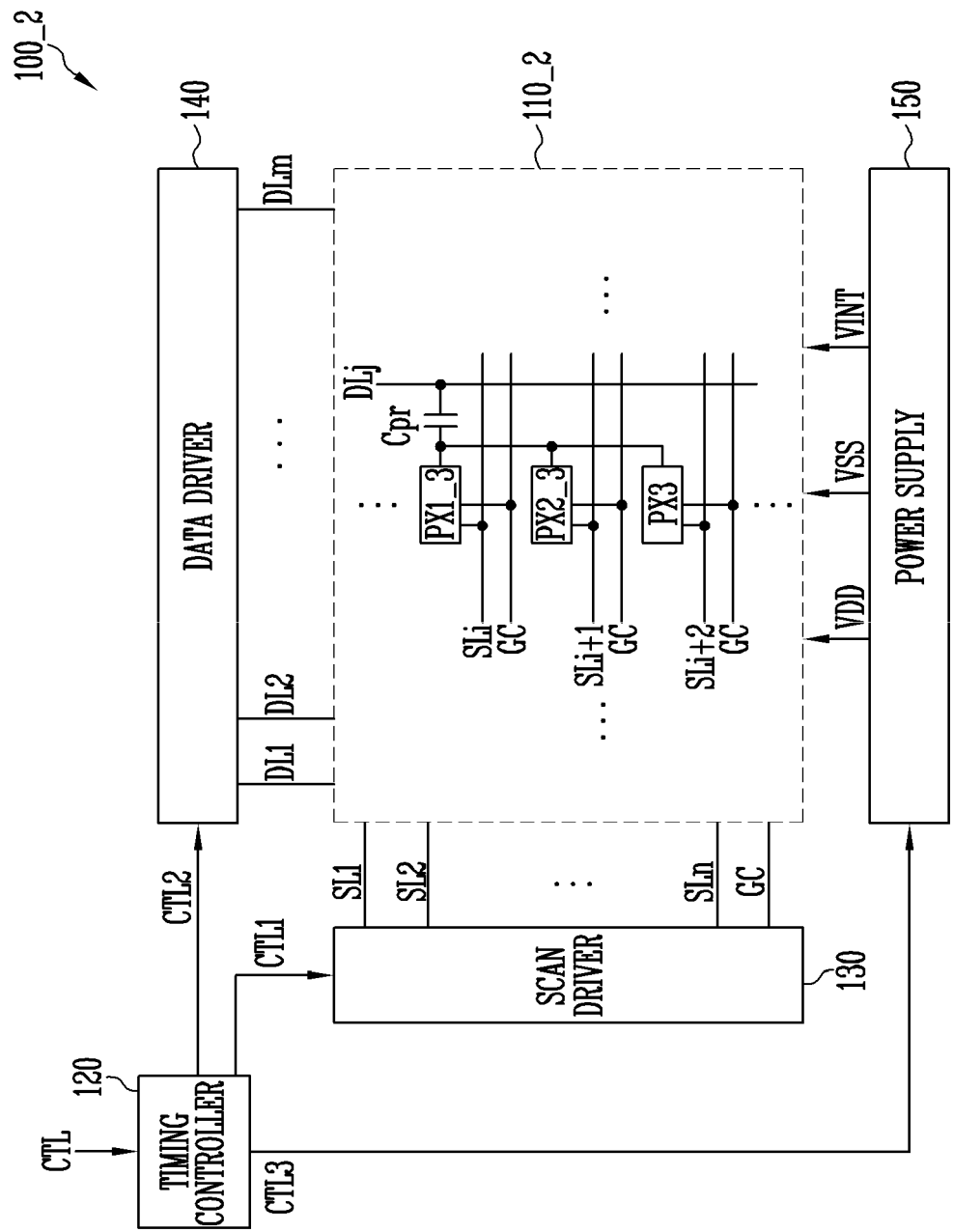
FIG. 9 is a diagram illustrating the display device according to some example embodiments of the disclosure.
Figure 10:
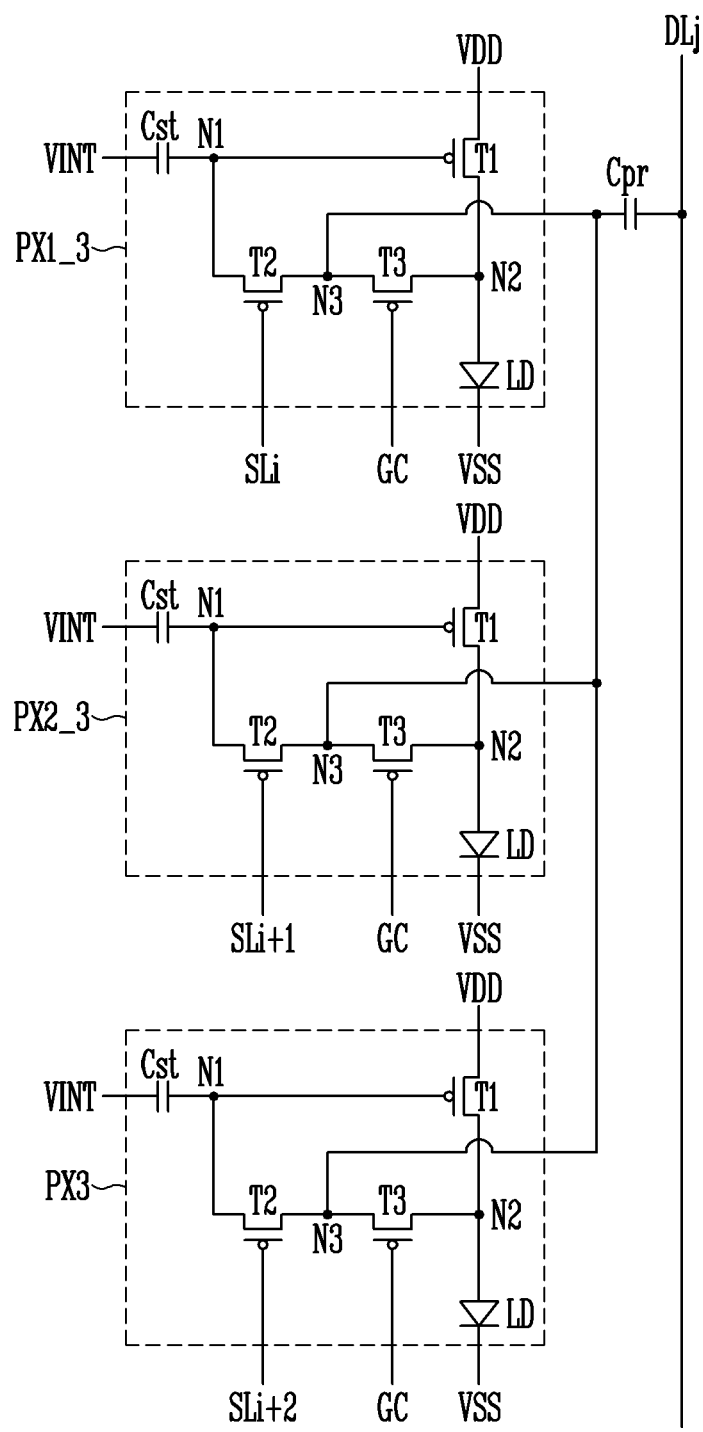
FIG. 10 is a circuit diagram illustrating an example of first to third pixels included in the display device of FIG. 9.

FIG. 9 is a diagram illustrating the display device according to some example embodiments of the disclosure, and FIG. 10 is a circuit diagram illustrating an example of first to third pixels included in the display device of FIG. 9. Although various electrical circuit components are illustrated in FIG. 10, embodiments according to the present invention may be modified without departing from the spirit and scope of the present invention. For example, according to some example embodiments, additional or fewer electrical circuit components may be included in the pixel circuit without departing from the spirit and scope of embodiments according to the present invention.

Referring to FIGS. 1 and 9, except for the third pixel PX3 included in a display panel 110_2, the display device 100_2 of FIG. 9 is substantially the same as the display device 100 of FIG. 1, and thus some repetitive description may be omitted.

Referring to FIG. 9, the display panel 110_2 may include pixels, and the pixels may include the first to third pixels PX1_3, PX2_3, and PX3.

According to some example embodiments, the first pixel PX1_3 may be connected to an i-th (where i is a natural number equal to or greater than 1 and equal to or less than n−2) scan line SLi among the first to n-th scan lines SL1, SL2, . . . , and SLn, and the common control line GC, the second pixel PX2_3 may be connected to an (i+1)-th scan line SLi+1 among the first to n-th scan lines SL1, SL2, . . . , and SLn, and the common control line GC, and the third pixel PX3 may be connected to an (i+2)-th scan line SLi+2 among the first to n-th scan lines SL1, SL2, . . . , and SLn, and the common control line GC. The first to third pixels PX1, PX2, and PX3 may be connected to the j-th (where j is a natural number equal to or greater than 1 and equal to or less than m) data line DLj among the first to m-th data lines DL1, DL2, . . . , and DLm.

According to some example embodiments, the first to third pixels PX1_3, PX2_3, and PX3 (or first to third pixel areas) may be sequentially adjacent to each other along the direction (for example, the second direction DR2 (refer to FIG. 7)) in which the j-th data line DLj extends.

Referring to FIGS. 2 and 10, except for the third pixel PX3 of FIG. 10, the first and second pixels PX1_3 and PX2_3 of FIG. 10 are substantially the same as the first and second pixels PX1 and PX2 of FIG. 2, and thus some repetitive description may be omitted.

Referring to FIG. 10, the third pixel PX3 may include first to third transistors T1, T2, and T3, a second capacitor Cst, and a light emitting element LD, and the first to third pixels PX1_3, PX2_3, and PX3 may share the first capacitor Cpr.

In a case of the third pixel PX3, except for a configuration in which a gate electrode of the second transistor T2 is connected to the (i+2)-th scan line SLi+2, the third pixel PX3 is substantially the same as the first and second pixels PX1_3 and PX2_3, and thus some repetitive description may be omitted.

The first capacitor Cpr may be connected to the j-th data line DLj, the first pixel PX1_3, the second pixel PX2_3, and the third pixel PX3. According to some example embodiments, the first capacitor Cpr may include a first electrode connected to the j-th data line DLj to receive the data voltage from the j-th data line DLj, and a second electrode connected to the third node N3 of each of the first to third pixels PX1_3, PX2_3, and PX3.

Meanwhile, in FIGS. 9 and 10, the number of pixels sharing the first capacitor Cpr is three, but this is merely an example, and the number of pixels sharing the first capacitor Cpr is not limited thereto. For example, the number of pixels sharing the first capacitor Cpr may be four or more, and the four or more pixels sharing the first capacitor Cpr may be sequentially adjacent to each other along the direction (for example, the second direction DR2 (refer to FIG. 7) in which the j-th data line DLj extends.

As described with reference to FIGS. 9 and 10, the sequentially adjacent first to third pixels PX1_3, PX2_3, and PX3 share the first capacitor Cpr connected to the j-th data line DLj. Therefore, a size of first to third pixel areas provided with the first to third pixels PX1_3, PX2_3, and PX3 may be further reduced. Thus, the display panel of high resolution and high integration may be implemented.

The foregoing detailed description illustrates and describes the disclosure. In addition, the foregoing description merely shows and describes example embodiments according to the disclosure, and as described above, the disclosure may be used in various other combinations, modifications, and environments, and the disclosure may be changed or modified within the scope of the concept of the disclosure disclosed in this specification, the scope equivalent to the disclosed disclosure, and/or the skill or knowledge in the art. Accordingly, the detailed description of the disclosure is not intended to limit the disclosure to the disclosed example embodiments. Also, the appended claims and their equivalents should be construed as including other embodiments.

What is claimed is:
1. A display panel comprising:
a first scan line, a second scan line, and a third scan line;
a data line;
a first pixel in a first pixel area, connected to the first scan line and the second scan line, and connected to the data line through a first capacitor; and a second pixel in a second pixel area, connected to the second scan line and the third scan line, and connected to the data line through the first capacitor.

2. The display panel according to claim 1, wherein the first to third scan lines extend in a first direction,
wherein the data line extends in a second direction crossing the first direction, and
wherein the first pixel area and the second pixel area are adjacent to each other along the second direction.

3. The display panel according to claim 2, wherein the first pixel comprises:
a first transistor including a gate electrode connected to a first node, a first electrode connected to a first power, and a second electrode connected to a second node;
a second transistor including a gate electrode connected to the first scan line, a first electrode connected to the first node, and a second electrode connected to a third node;
a third transistor including a gate electrode connected to the second scan line, a first electrode connected to the third node, and a second electrode connected to the second node;
a first light emitting element including a first electrode connected to the second node and a second electrode connected to a second power; and
a second capacitor including a first electrode connected to the first node and a second electrode connected to a third power, and
wherein the first capacitor includes a first electrode connected to the data line and a second electrode connected to the third node.

4. The display panel according to claim 3, wherein the second pixel comprises:
a fourth transistor including a gate electrode connected to a fourth node, a first electrode connected to the first power, and a second electrode connected to a fifth node;
a fifth transistor including a gate electrode connected to the third scan line, a first electrode connected to the fourth node, and a second electrode connected to a sixth node;
a sixth transistor including a gate electrode connected to the second scan line, a first electrode connected to the sixth node, and a second electrode connected to the fifth node;
a second light emitting element including a first electrode connected to the fifth node and a second electrode connected to the second power; and
a third capacitor including a first electrode connected to the fourth node and a second electrode connected to the third power, and
wherein the second electrode of the first capacitor is connected to the sixth node.

5. The display panel according to claim 4, wherein the second transistor comprises:
a first sub transistor including a gate electrode connected to the first scan line, a first electrode connected to the first node, and a second electrode; and
a second sub transistor including a gate electrode connected to the first scan line, a first electrode connected to the second electrode of the first sub transistor, and a second electrode connected to the third node, and
wherein the fifth transistor comprises:
a third sub transistor including a gate electrode connected to the third scan line, a first electrode connected to the fourth node, and a second electrode; and
a fourth sub transistor including a gate electrode connected to the third scan line, a first electrode connected to the second electrode of the third sub transistor, and a second electrode connected to the sixth node.

6. The display panel according to claim 4, wherein the second electrode of the first capacitor is positioned in the first and second pixel areas, and
wherein a portion of the data line overlaps the second electrode of the first capacitor to form the first electrode of the first capacitor.

7. The display panel according to claim 6, wherein the first pixel and the second pixel are symmetrical with respect to a boundary line to which the first pixel area and the second pixel area are adjacent.

8. The display panel according to claim 3, wherein the second pixel comprises:
a fourth transistor including a gate electrode connected to a fourth node, a first electrode connected to the first power, and a second electrode connected to a fifth node;
a fifth transistor including a gate electrode connected to the second scan line, a first electrode connected to the fourth node, and a second electrode connected to a sixth node;
a sixth transistor including a gate electrode connected to the third scan line, a first electrode connected to the sixth node, and a second electrode connected to the fifth node;
a second light emitting element including a first electrode connected to the fifth node and a second electrode connected to the second power; and
a third capacitor including a first electrode connected to the fourth node and a second electrode connected to the third power, and
wherein the second electrode of the first capacitor is connected to the sixth node.

9. The display panel according to claim 2, further comprising:
a fourth scan line extending in the first direction; and
a third pixel in a third pixel area, connected to the second scan line and the fourth scan line, and connected to the data line through the first capacitor,
wherein the third pixel area is adjacent to the second pixel area along the second direction.

10. The display panel according to claim 1, wherein the first pixel and the second pixel emit light with different colors.

11. A display panel comprising:
a substrate including a first pixel area and a second pixel area;
a semiconductor layer including a first semiconductor pattern in the first pixel area of the substrate and a second semiconductor pattern in the second pixel area of the substrate;
a first conductive layer on the semiconductor layer, and including a first gate electrode overlapping the first semiconductor pattern and a second gate electrode overlapping the second semiconductor pattern;
a second conductive layer on the first conductive layer, and including a first scan line extending in a first direction and in the first pixel area, and a second scan line extending in the first direction and in the second pixel area;
a third conductive layer on the second conductive layer, and including a data line extending across the first and second pixel areas in a second direction crossing the first direction; and a fourth conductive layer on the third conductive layer, overlapping a portion of the data line, and including a first electrode of a first capacitor over the first and second pixel areas, wherein the first electrode of the first capacitor is electrically connected to each of the first and second semiconductor patterns, and wherein the portion of the data line overlapping the first electrode of the first capacitor configures a second electrode of the first capacitor.

12. The display panel according to claim 11, wherein the third conductive layer further comprises:
a third electrode in the first pixel area and electrically connected to the data line; and
a fourth electrode in the second pixel area and electrically connected to the data line,
wherein the third and fourth electrodes overlap the first electrode of the first capacitor, and further configure the second electrode of the first capacitor.

13. The display panel according to claim 11, wherein the first semiconductor pattern includes a first sub semiconductor pattern, a second sub semiconductor pattern, and a third sub semiconductor pattern connecting one side of the first sub semiconductor pattern and one side of the second sub semiconductor pattern to each other, and
wherein the second semiconductor pattern includes a fourth sub semiconductor pattern, a fifth sub semiconductor pattern, and a sixth sub semiconductor pattern connecting one side of the fourth sub semiconductor pattern and one side of the fifth sub semiconductor pattern to each other.

14. The display panel according to claim 13, wherein the first electrode of the first capacitor is connected between the second sub semiconductor pattern and the third sub semiconductor pattern, and is connected between the fifth sub semiconductor pattern and the sixth sub semiconductor pattern.

15. The display panel according to claim 13, wherein the first gate electrode includes a first sub gate electrode overlapping the first sub semiconductor pattern, a second sub gate electrode overlapping the second sub semiconductor pattern, and a third sub gate electrode overlapping the third sub semiconductor pattern, and
wherein the second gate electrode includes a fourth sub gate electrode overlapping the fourth sub semiconductor pattern, a fifth sub gate electrode overlapping the fifth sub semiconductor pattern, and a sixth sub gate electrode overlapping the sixth sub semiconductor pattern.

16. The display panel according to claim 15, wherein the second conductive layer further comprises:
a second electrode of a second capacitor on the first pixel area and overlapping a portion of the first sub gate electrode; and
a second electrode of a third capacitor on the second pixel area and overlapping a portion of the fourth sub gate electrode,
wherein the portion of the first sub gate electrode overlapping the second electrode of the second capacitor configures a first electrode of the second capacitor, and
wherein the portion of the fourth sub gate electrode overlapping the second electrode of the third capacitor configures a first electrode of the third capacitor.

17. The display panel according to claim 16, wherein the second conductive layer further comprises:
a first bridge pattern on the first pixel area, and overlapping the first sub gate electrode and another side of the second sub semiconductor pattern to electrically connect the first sub gate electrode and the another side of the second sub semiconductor pattern to each other; and
a second bridge pattern on the second pixel area, and overlapping the fourth sub gate electrode and another side of the fifth sub semiconductor pattern to electrically connect the fourth sub gate electrode and the another side of the fifth sub semiconductor pattern.

18. The display panel according to claim 17, wherein the second conductive layer further comprises:
a third scan line extending in the first direction and in the first pixel area; and
a fourth scan line extending in the first direction, in the second pixel area, and electrically connected to the third scan line, and
wherein the first scan line is electrically connected to the second sub gate electrode, the third scan line is electrically connected to the third sub gate electrode, the second scan line is electrically connected to the fifth sub gate electrode, and the fourth scan line is electrically connected to the sixth sub gate electrode.

19. The display panel according to claim 16, wherein the fourth conductive layer further comprises an initialization power line extending across the first and second pixel areas in the second direction, and
wherein the initialization power line overlaps the second electrode of the second capacitor and the second electrode of the third capacitor to be electrically connected to the second electrode of the second capacitor and the second electrode of the third capacitor.

20. The display panel according to claim 19, wherein the fourth conductive layer further comprises a driving power line extending across the first and second pixel areas in the second direction, and
wherein the driving power line overlaps another side of the first sub semiconductor pattern and another side of the fourth sub semiconductor pattern to be electrically connected to the another side of the first sub semiconductor pattern and the another side of the fourth sub semiconductor pattern.

\* \* \* \* \*